(12) United States Patent
Ting et al.

(10) Patent No.: US 12,007,319 B2
(45) Date of Patent: Jun. 11, 2024

(54) OPTICAL PATH CORRECTION SUBASSEMBLY, OPTICAL DETECTION ASSEMBLY, AND OPTICAL DETECTION SYSTEM

(71) Applicant: MPI CORPORATION, Hsinchu County (TW)

(72) Inventors: Po-Yi Ting, Hsinchu County (TW); Ting-An Yen, Hsinchu County (TW); Yu-Hsun Hsu, Hsinchu County (TW); Sebastian Giessmann, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 17/979,748

(22) Filed: Nov. 2, 2022

(65) Prior Publication Data

US 2023/0147804 A1 May 11, 2023

Related U.S. Application Data

(60) Provisional application No. 63/276,671, filed on Nov. 8, 2021.

(51) Int. Cl.
*G01N 15/0205* (2024.01)
*G11B 7/135* (2012.01)
*H01S 5/00* (2006.01)

(52) U.S. Cl.
CPC ......... *G01N 15/0205* (2013.01); *G11B 7/135* (2013.01); *H01S 5/005* (2013.01)

(58) Field of Classification Search
CPC ...... G01N 15/0205; G11B 7/135; H01S 5/005
See application file for complete search history.

(56) References Cited

U.S. PATENT DOCUMENTS

| 5,642,056 A * | 6/1997 | Nakajima | G01R 31/2887 |
| | | | 324/754.03 |
| 7,871,810 B2 * | 1/2011 | Warren | G06V 10/24 |
| | | | 435/286.2 |
| 2017/0322133 A1 * | 11/2017 | Trainer | G01N 21/474 |

FOREIGN PATENT DOCUMENTS

CN 112444923 A 3/2021

* cited by examiner

*Primary Examiner* — Georgia Y Epps
*Assistant Examiner* — Don J Williams
(74) *Attorney, Agent, or Firm* — Li & Cai Intellectual Property Office

(57) ABSTRACT

An optical path correction subassembly, an optical detection assembly, and an optical detection system are provided. The optical path correction subassembly can be optionally configured to be applied to a light detector. The optical path correction subassembly includes a holder structure and an optical path correction structure carried by the holder structure, and the optical path correction structure has a light beam guiding surface arranged as a reverse inclination inclined relative to a vertical line. The light beam guiding surface of the optical path correction structure can be configured to effectively or accurately guide a predetermined light beam to a light receiving surface of the light detector so as to facilitate collection of the predetermined light beam. The light beam guiding surface of the optical path correction structure can be arranged at an acute angle relative to the light receiving surface of the light detector.

15 Claims, 19 Drawing Sheets

OPTICAL PATH CORRECTION SUBASSEMBLY, OPTICAL DETECTION ASSEMBLY, AND OPTICAL DETECTION SYSTEM

CROSS-REFERENCE TO RELATED PATENT APPLICATION

This application claims the benefit of priority to the U.S. Provisional Patent Application Ser. No. 63/276,671 filed on Nov. 8, 2021, which application is incorporated herein by reference in its entirety.

Some references, which may include patents, patent applications and various publications, can be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical path correction subassembly, an optical detection assembly, and an optical detection system, and more particularly to an optical path correction subassembly having a light beam guiding surface, the optical detection assembly using the optical path correction subassembly, and the optical detection system using the optical detection assembly.

BACKGROUND OF THE DISCLOSURE

In the related art, an optical probe system can be utilized to optically detect the operational performance of a device under test (DOT), such as a semiconductor device and/or an integrated circuit device. In addition, a photodiode (PD) is an electronic component that can be used to receive a light source and then convert the received light source into an output electrical signal. When a predetermined light beam generated by an optical probe of the optical probe system is provided to the photodiode, the electronic characteristic of the photodiode can be analyzed by receiving the electrical signal generated by the photodiode. Before, during and after the optical probe system detects the DUTs, the user constantly needs to use a light detector (such as using a photodiode) to optically detect the quality of the optical probe (i.e., an optical fiber) of the optical probe system.

Before, during and after the optical probe system is applied to optically detect the DUTs, in order to optically detect the quality of the optical probe that can be arranged in different orientations (such as different angles and/or heights), the quality of the optical probe is optically detected by manually holding the light detector in the prior technical means. However, since the light detector is manually held, the quality of the optical probe cannot be automatically detected. As a result, the convenience of detection is poor, and the detection efficiency cannot be effectively improved.

Before, during and after the optical probe system is applied to optically detect the DUTs, in order to automatically detect the quality of the optical probe by the light detector, an external adjustment mechanism is applied to adjust the light detector in different orientations (such as different angles and/or heights) in the prior technical means, so that the light detector adjusted by the external adjustment mechanism can be used to optically detect the quality of the optical probe arranged in different orientations (such as different angles and/or heights). However, as shown in FIG. 1, when the light detector is adjusted to be arranged at a predetermined inclined angle by an external adjustment mechanism (not shown), a top part of the light detector will be higher than the tips of two optical probes (respectively adjacent to two opposite sides of a wafer stage) of the optical probe system, so that the optical probe adjacent to the light detector will easily collide with the angle-adjusted light detector during the movement, and the another optical probe far from the light detector is blocked by the angle-adjusted light detector and cannot be optically detected through the light detector.

Furthermore, in order to solve the above-mentioned problems about "the optical probe adjacent to the light detector will easily collide with the angle-adjusted light detector during the movement" and "the another optical probe far from the light detector is blocked by the angle-adjusted light detector and cannot be optically detected through the light detector," the optical probe system needs to be equipped with a more complicated external adjustment mechanism, which not only increases the manufacturing cost of the optical probe system but also increases the difficulty of the optical probe system during operation.

SUMMARY OF THE DISCLOSURE

In order to solve the above-mentioned problems, the present disclosure provides an optical path correction subassembly, an optical detection assembly using the optical path correction subassembly, and an optical detection system using the optical detection assembly, so that in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost. It should be noted that since the orientation of the optical detection assembly does not need to be adjusted (for example, the optical detection assembly does not need to be tilted), the entire optical detection assembly can be located at a lower position than the entire wafer stage or at the same height as the entire wafer table (that is to say, an upper surface of the optical path correction structure can be equal to or lower than a wafer carrying surface of the wafer stage), so that the optical probe of the optical probe assembly adjacent to the optical detection assembly will not collide with the relatively low optical detection assembly during the movement, and another optical probe of the optical probe assembly far from the optical detection assembly will not be blocked by the relatively low optical detection assembly and can be optically detected by the same light detector.

In order to solve the above-mentioned problems, one of the technical aspects adopted by the present disclosure is to provide an optical path correction subassembly optionally configured to be applied to a light detector. The optical path correction subassembly includes a holder structure and an optical path correction structure carried by the holder structure, and the optical path correction structure has a light beam guiding surface arranged as a reverse inclination inclined relative to a vertical line. When the holder structure is optionally configured to be detachably disposed on the light detector, the light beam guiding surface of the optical path correction structure is configured to effectively or accurately guide a predetermined light beam to a light receiving surface of the light detector so as to facilitate collection of the predetermined light beam. When the holder structure is optionally configured to be detachably disposed on the light detector, the light beam guiding surface of the optical path correction structure is arranged at an acute angle relative to the light receiving surface of the light detector.

In the optical path correction subassembly provided by one of the technical aspects of the present disclosure, the optical path correction structure has a light beam guiding surface arranged as a reverse inclination inclined relative to a vertical line, and the light beam guiding surface of the optical path correction structure is arranged at an acute angle relative to the light receiving surface of the light detector, so that when the holder structure is optionally configured to be detachably disposed on the light detector, the light beam guiding surface of the optical path correction structure can be configured to effectively or accurately guide a predetermined light beam to the light receiving surface of the light detector so as to collect the predetermined light beam by the light receiving surface of the light detector.

Therefore, in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost.

In order to solve the above-mentioned problems, another one of the technical aspects adopted by the present disclosure is to provide an optical detection assembly including a light detector and an optical path correction subassembly. The light detector has a light receiving surface. The optical path correction subassembly includes a holder structure detachably disposed on the light detector and an optical path correction structure carried by the holder structure. The optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector. The light beam guiding surface of the optical path correction structure is configured to effectively or accurately guide a predetermined light beam to a light receiving surface of the light detector so as to facilitate collection of the predetermined light beam.

In the optical detection assembly provided by one of the technical aspects of the present disclosure, the optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector, so that when the holder structure is optionally configured to be detachably disposed on the light detector, the light beam guiding surface of the optical path correction structure can be configured to effectively or accurately guide a predetermined light beam to the light receiving surface of the light detector so as to collect the predetermined light beam by the light receiving surface of the light detector.

Therefore, in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost.

In order to solve the above-mentioned problems, yet another one of the technical aspects adopted by the present disclosure is to provide an optical detection system including a chuck stage, an optical probe assembly and an optical detection assembly. The chuck stage includes a chuck for carrying a plurality of predetermined objects. The optical probe assembly is configured to be disposed above the chuck for optically detecting the predetermined object. The optical detection assembly is configured adjacent to the chuck of the chuck stage for optically detecting a predetermined light beam provided by the optical probe assembly. The optical detection assembly includes a light detector and an optical path correction subassembly, the light detector has a light receiving surface, and the optical path correction subassembly includes a holder structure detachably disposed on the light detector and an optical path correction structure carried by the holder structure. The optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector. The light beam guiding surface of the optical path correction structure is configured to guide the predetermined light beam to a light receiving surface of the light detector so as to facilitate collection of the predetermined light beam. An upper surface of the optical path correction structure of the optical path correction subassembly is equal to or lower than a wafer carrying surface of the chuck of the chuck stage.

In the optical detection system provided by one of the technical aspects of the present disclosure, the optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector, so that when the holder structure is optionally configured to be detachably disposed on the light detector, the light beam guiding surface of the optical path correction structure can be configured to effectively or accurately guide a predetermined light beam to the light receiving surface of the light detector so as to collect the predetermined light beam by the light receiving surface of the light detector. Moreover, when the optical path correction subassembly is optionally configured adjacent to the chuck of the chuck stage, the upper surface of the optical path correction structure of the optical path correction subassembly can be equal to or lower than the wafer carrying surface of the chuck of the chuck stage so as to prevent the optical probe assembly from being touched by the optical path correction subassembly.

Therefore, in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost. It should be noted that since the orientation of the optical detection assembly does not need to be adjusted (for example, the optical detection assembly does not need to be tilted), the entire optical detection assembly can be located at a lower position than the entire wafer stage or at the same height as the entire wafer table (that is to say, an upper surface of the optical path correction structure can be equal to or lower than a wafer carrying surface of the wafer stage), so that the optical probe of the optical probe assembly adjacent to the optical detection assembly will not collide with the relatively low optical detection assembly during the movement, and another optical probe of the optical probe assembly far from the optical detection assembly will not be blocked by the relatively low optical detection assembly and can be optically detected by the same light detector.

In one of the possible or preferred embodiments, when the holder structure is optionally configured to be movably disposed on the light detector, a relative perpendicular height of the light beam guiding surface of the optical path correction structure relative to the light receiving surface of the light detector is adjustable. When the holder structure is optionally configured to be adjustably disposed on different predetermined positions of the light detector through at least one fixing element, the relative perpendicular height of the light beam guiding surface of the optical path correction structure relative to the light receiving surface of the light detector is adjustable according to the holder structure that is adjustably disposed on the different predetermined positions of the light detector. When the at least one fixing element passes through at least one side through hole of the holder structure to cooperate with one of a plurality of matching holes of the light detector, the holder structure is adjustably disposed on the different predetermined positions of the light detector by cooperation of the at least one fixing element and the matching holes, so that the holder structure is configured to adjust the relative perpendicular height of the light beam guiding surface of the optical path correction structure relative to the light receiving surface of the light detector by cooperation of the at least one fixing element and the matching holes. When the holder structure is optionally configured to be adjustably disposed on different predetermined positions of the light detector by rotating, the relative perpendicular height of the light beam guiding surface of the optical path correction structure relative to the light receiving surface of the light detector is adjustable according to the holder structure that is adjustably disposed on the different predetermined positions of the light detector. When an inner thread of the holder structure and an outer thread of the light detector cooperate with each other, the holder structure is adjustably disposed on the different predetermined positions of the light detector by cooperation of the inner thread of the holder structure and the outer thread of the light detector, so that the holder structure is configured to adjust the relative perpendicular height of the light beam guiding surface of the optical path correction structure relative to the light receiving surface of the light detector by cooperation of the inner thread of the holder structure and the outer thread of the light detector.

In the above-mentioned possible or preferred embodiments, the relative perpendicular height of the light beam guiding surface of the optical path correction structure relative to the light receiving surface of the light detector is adjustable, so that in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam provided by the optical probe of the optical probe assembly to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost. For example, the holder structure can be adjustably disposed on the different predetermined positions of the light detector by cooperation of the at least one fixing element and the matching holes, so that the holder structure can be configured to adjust the relative perpendicular height of the light beam guiding surface of the optical path correction structure relative to the light receiving surface of the light detector by cooperation of the at least one fixing element and the matching holes. Alternatively, the holder structure can be adjustably disposed on the different predetermined positions of the light detector by cooperation of the inner thread of the holder structure and the outer thread of the light detector, so that the holder structure can be configured to adjust the relative perpendicular height of the light beam guiding surface of the optical path correction structure relative to the light receiving surface of the light detector by cooperation of the inner thread of the holder structure and the outer thread of the light detector.

In one of the possible or preferred embodiments, when the optical path correction subassembly is optionally configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable. The optical path correction structure includes a one-piece optical element or a combined-type optical element composed of a plurality of optical matching parts. The optical path correction structure has a through opening for accommodating the light beam guiding surface, the through opening is shaped as a closed shape or an open shape, and the through opening is provided by the one-piece optical element or is formed by combining the optical matching parts of the combined-type optical element. The through opening has a topmost opening and a bottommost opening, a size of the topmost opening is smaller than a size of the bottommost opening, and the size of the topmost opening and the size of the bottommost opening have a proportional relationship within a predetermined range. The light beam guiding surface of the optical path correction structure has a plurality of light beam guiding regions, and the light beam guiding regions are configured to be disposed on the one-piece optical element or configured to be respectively disposed on the optical matching parts of the combined-type optical element, and the light beam guiding regions have a same inclination angle or different inclination angles relative to a vertical line.

In the above-mentioned possible or preferred embodiments, the relative inclination angle of the light beam guiding surface of the optical path correction structure relative to the light receiving surface of the light detector is adjustable, so that in the case where the orientation of the light detector (such as using a photodiode) provided by the present disclosure does not need to be adjusted by an external adjustment mechanism, the light detector can still be used to optically detect the quality of an optical probe (i.e., an optical fiber) of an optical probe assembly arranged in different orientations (such as different angles and/or heights) by use of the optical path correction subassembly having a light beam guiding surface for effectively or accurately guiding a predetermined light beam to a light receiving surface of the light detector. Hence, before, during and after the optical detection system is applied to optically detect a plurality of predetermined objects (such as DUTs), the present disclosure can automatically detect the quality of the optical probe of the optical probe assembly by use of the optical path correction subassembly having the light beam guiding surface without the assistance of the external adjustment mechanism, so as to simplify the mechanical structure and achieve the advantage of reducing cost. For example, the present disclosure can adjust the relative inclination angle of the light beam guiding surface of the optical path correction structure relative to the light receiving surface of the light detector through the following different methods so as to meet the different customized requirements. The different methods for adjusting the relative inclination angle can be at least one or more of the following possible solutions: (1) the optical path correction structure can be a one-piece optical element or a combined-type optical element composed of a plurality of optical matching parts; (2) the through opening can be provided by the one-piece optical element or can be formed by combining the optical matching parts of the combined-type optical element; (3) for the through opening, the size of the topmost opening can be smaller than the size of the bottommost opening, and the size of the topmost opening and the size of the bottommost opening have a proportional relationship within a predetermined range; and (4) the light beam guiding regions can be configured to be disposed on the one-piece optical element or configured to be respectively disposed on the optical matching parts of the combined-type optical element, and the light beam guiding regions have a same inclination angle or different inclination angles relative to a vertical line.

These and other aspects of the present disclosure will become apparent from the following description of the embodiment taken in conjunction with the following drawings and their captions, although variations and modifications therein can be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
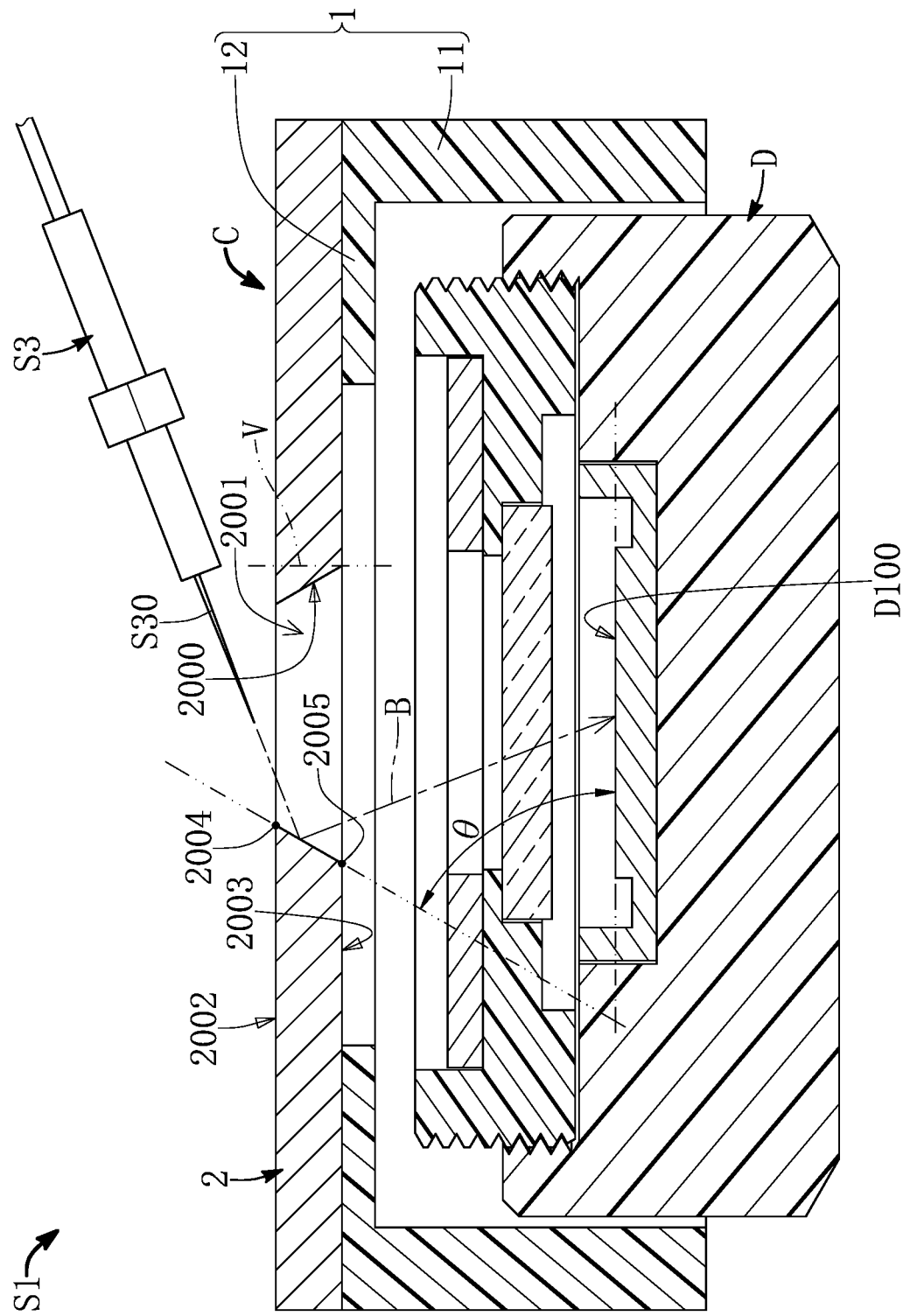
FIG. 1 is a partial schematic cross-sectional view of a first optical detection assembly using an optical path correction subassembly provided by a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 11, a first embodiment of the present disclosure provides an optical detection assembly S1 including a light detector D and an optical path correction subassembly C (or an optical path adjustment subassembly), in which as shown in FIG. 1, the light detector D has a light receiving surface D100 (such as a light receiving surface provided by a photodiode), and the optical path correction subassembly C includes a holder structure 1 detachably disposed on the light detector D and an optical path correction structure 2 (or an optical path adjustment structure 2) carried by the holder structure 1. It should be noted that the optical path correction subassembly C can be optionally configured to be applied to the light detector D according to different requirements.

More particularly, as shown in FIG. 1, the holder structure 1 includes a matching portion 11 and a carrying portion 12 disposed on the matching portion 11, in which the matching portion 11 of the holder structure 1 can be configured to cooperate with the light detector D, and the carrying portion 12 of the holder structure 1 can be configured to carry the optical path correction structure 2. For example, the matching portion 11 and the light detector D can be moved or rotated with each other, and the optical path correction structure 2 can be detachably or fixedly disposed outside the holder structure 1 and located on a top side of the holder structure 1 (as shown in FIG. 1), or the optical path correction structure 2 can be detachably or fixedly disposed inside the holder structure 1 and surrounded by the holder structure 1. However, the aforementioned details are disclosed for exemplary purposes only, and are not meant to limit the scope of the present disclosure.

Figure 2:
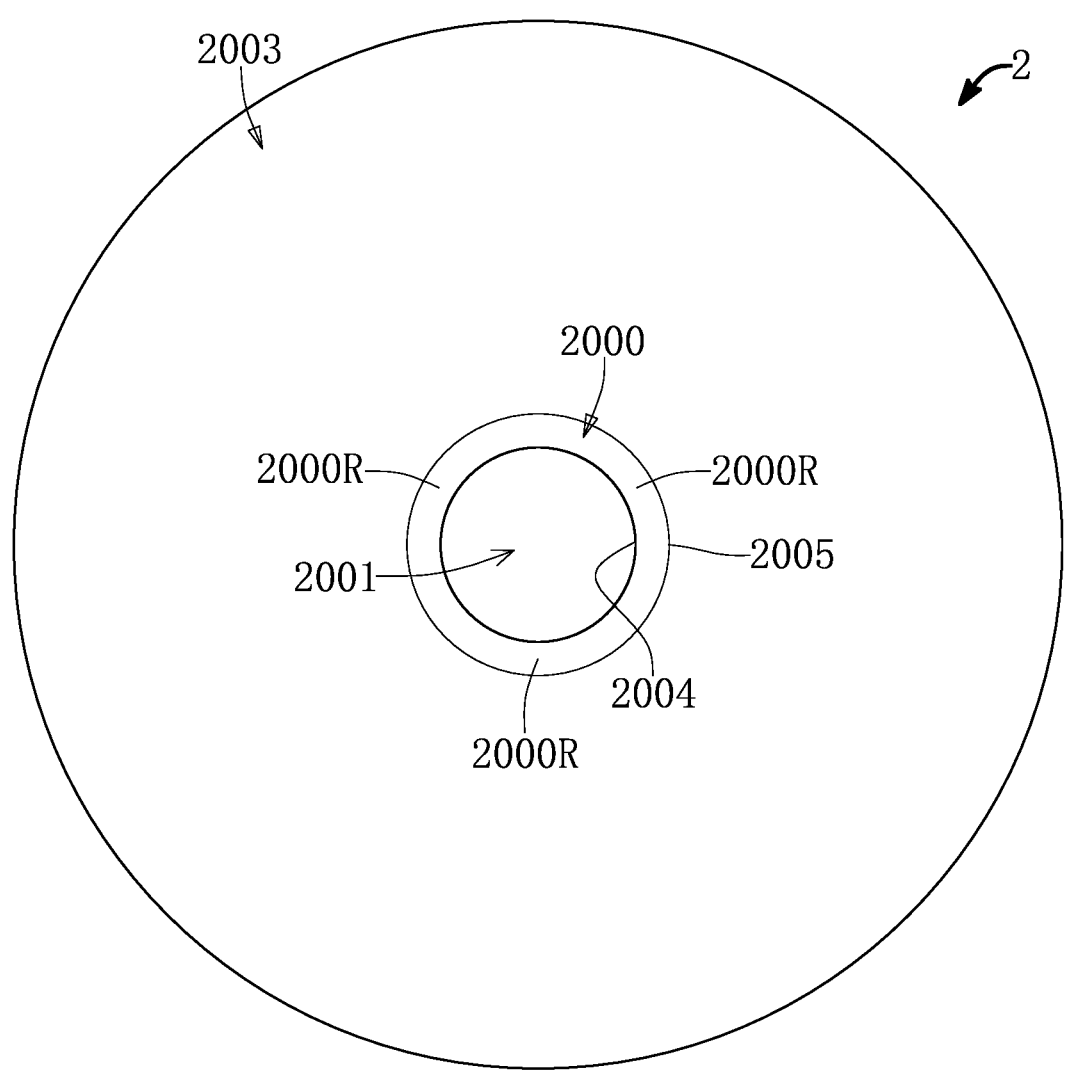
FIG. 2 is a schematic bottom view of a first optical path correction structure of the optical path correction subassembly provided by the first embodiment of the present disclosure.

More particularly, referring to FIG. 1 and FIG. 2, the optical path correction structure 2 has a light beam guiding surface 2000 arranged as a reverse inclination facing the light receiving surface D100 of the light detector D in a vertical direction, and the optical path correction structure 2 has a through opening 2001 for accommodating the light beam guiding surface 2000. That is to say, as shown in FIG. 1, the optical path correction structure 2 has a light beam guiding surface 2000 arranged as a reverse inclination inclined relative to a vertical line V, the light beam guiding surface 2000 can be inclined counterclockwise with respect to the vertical line V, and the perpendicular projection of the light beam guiding surface 2000 can be projected onto the light receiving surface D100 of the light detector D. For example, the optical path correction structure 2 has an upper surface 2002, a lower surface 2003 opposite to the upper surface 2002, a top connecting interface 2004 (i.e., a topmost side of the light beam guiding surface 2000) connected between the upper surface 2002 and the light beam guiding surface 2000, and a bottom connecting interface 2005 (i.e., a bottommost side of the light beam guiding surface 2000) connected between the lower surface 2003 and the light beam guiding surface 2000, and the top connecting interface 2004 and the bottom connecting interface 2005 can directly face the light detector D in a perpendicular direction (that is to say, both the perpendicular projection of the top connecting interface 2004 and the perpendicular projection of the bottom connecting interface 2005 can be projected onto the light receiving surface D100 of the light detector D). More particularly, the top connecting interface 2004 is closer to a center line of the through opening 2001 than the bottom connecting interface 2005, and the top connecting interface 2004 is closer to a center line of the light detector D than the bottom connecting interface 2005. It should be noted that the light beam guiding surface 2000 can be provided by an optical coating layer that is additionally formed (for example, by coating, electroplating, vapor deposition or any forming method) on the optical path correction structure 2 (that is to say, the optical path correction structure 2 includes an optical coating layer having a light beam guiding surface 2000), or the light beam guiding surface 2000 can be provided by a material surface layer that is possessed by the optical path correction structure 2 itself (that is to say, the material surface layer of the optical path correction structure 2 has a light beam guiding surface 2000). However, the aforementioned details are disclosed for exemplary purposes only, and are not meant to limit the scope of the present disclosure.

More particularly, referring to FIG. 1 and FIG. 2, when the holder structure 1 is optionally configured to be detachably disposed on the light detector D, the light beam guiding surface 2000 of the optical path correction structure 2 is arranged at an acute angle θ relative to the light receiving surface D100 of the light detector D. Therefore, as shown in FIG. 1, when the holder structure 1 is optionally configured to be detachably disposed on the light detector D, the light beam guiding surface 2000 of the optical path correction structure 2 can be configured to effectively or accurately reflect (or guide, direct, transmit) a predetermined light beam B provided by the optical probe assembly S3 to the light receiving surface D100 of the light detector D so as to collect the predetermined light beam B by the light receiving surface D100 of the light detector D. It should be noted that the light beam guiding surface 2000 of the optical path correction structure 2 can be configured to be located on an optical path between an optical probe assembly S3 for providing the predetermined light beam B and the light receiving surface D100 of the light detector D, so that the light beam guiding surface 2000 of the optical path correction structure 2 can be configured to effectively or accurately reflect (or guide, direct, transmit) the predetermined light beam B provided by the optical probe assembly S3 to the light receiving surface D100 of the light detector D so as to collect the predetermined light beam B by the light receiving surface D100 of the light detector D.

In one of possible embodiments, referring to FIG. 3 to FIG. 6, when the holder structure 1 is optionally configured to be movably disposed on the light detector D, a relative perpendicular height H of the light beam guiding surface 2000 of the optical path correction structure 2 relative to the light receiving surface D100 of the light detector D is adjustable. For example, the relative perpendicular height H can be defined as a distance between the bottom connecting interface 2005 of the light beam guiding surface 2000 and the light receiving surface D100 of the light detector D (as shown in FIG. 3 to FIG. 6), or the relative perpendicular height H can also be defined as a distance between the top connecting interface 2004 of the light beam guiding surface 2000 and the light receiving surface D100 of the light detector D. For another example, the relative perpendicular height H can also be defined as a distance between any reference point provided by the light beam guiding surface 2000 and the light receiving surface D100 of the light detector D. However, the aforementioned details are disclosed for exemplary purposes only, and are not meant to limit the scope of the present disclosure.

Figure 3:
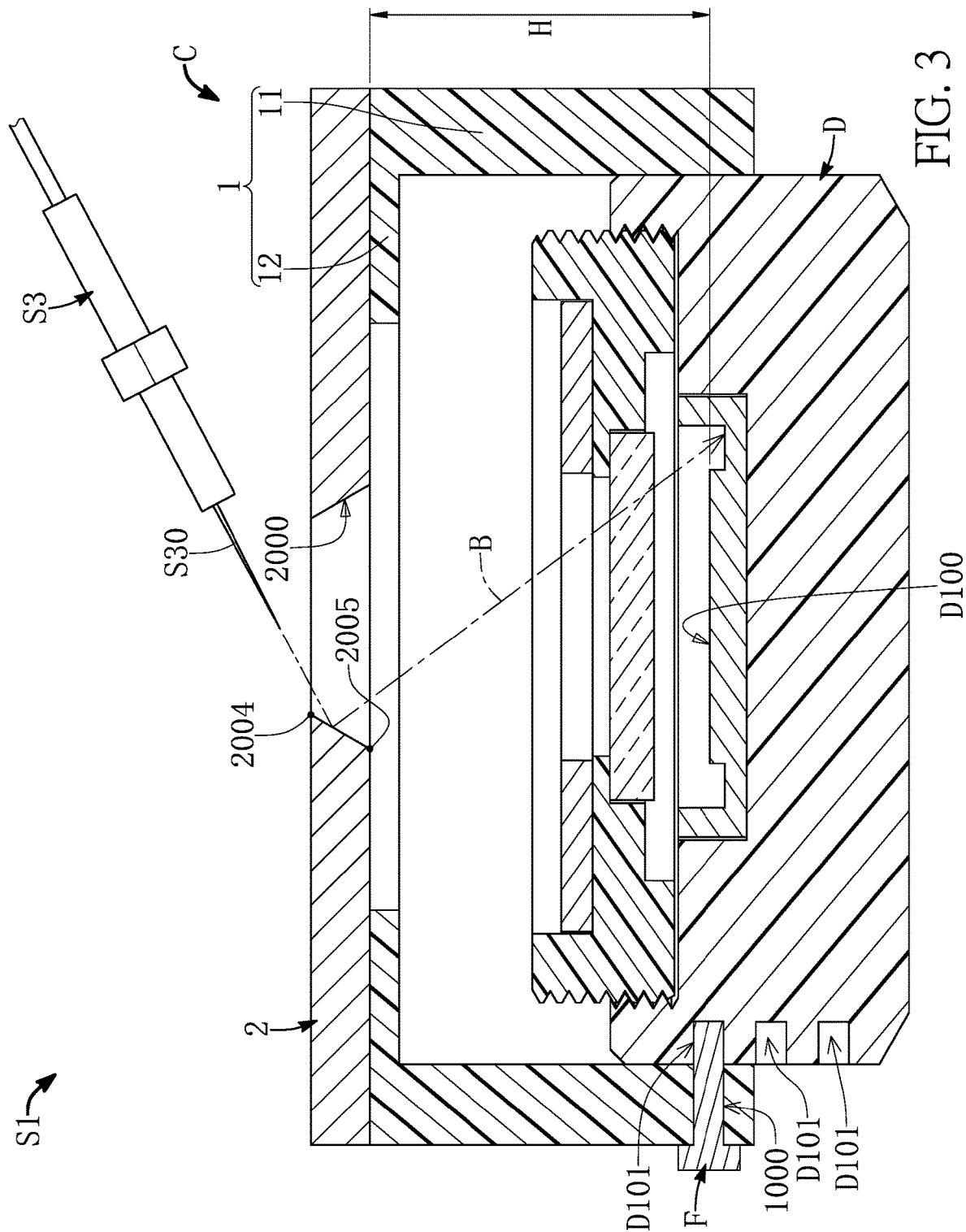
FIG. 3 is a schematic partial cross-sectional view of a second optical detection assembly using the optical path correction subassembly provided by the first embodiment of the present disclosure (when a predetermined light beam provided by an optical probe assembly cannot be guided to a light receiving surface of a light detector)
Figure 4:
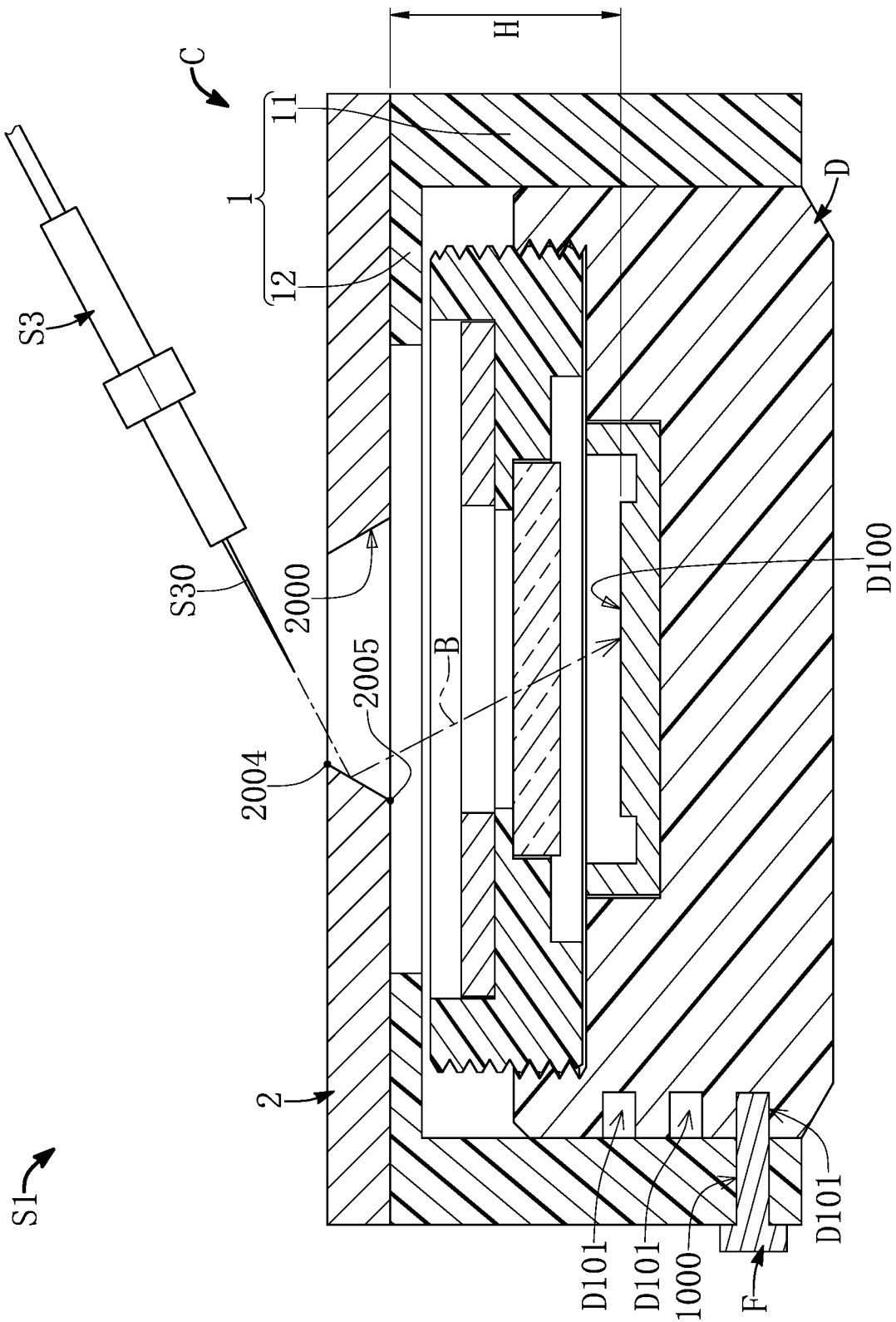
FIG. 4 is a partial schematic cross-sectional view of the second optical detection assembly using the optical path correction subassembly provided by the first embodiment of the present disclosure (when the predetermined light beam provided by the optical probe assembly can be guided to the light receiving surface of the light detector)

For example, referring to FIG. 3 and FIG. 4, when the holder structure 1 is optionally configured to be adjustably disposed on different predetermined positions of the light detector D through at least one fixing element F (such as a bolt, a screw nail or any kind of fixing element), the relative perpendicular height H of the light beam guiding surface 2000 of the optical path correction structure 2 relative to the light receiving surface D100 of the light detector D can be adjustable according to the holder structure 1 that can be adjustably disposed on the different predetermined positions of the light detector D. More particularly, when the at least one fixing element F passes through at least one side through hole 1000 of the holder structure 1 to cooperate with one of a plurality of matching holes D101 of the light detector D (for example, FIG. 3 shows at least one fixing element F passing through at least one side through hole 1000 to cooperate with the topmost one of the matching holes D101, and FIG. 4 shows at least one fixing element F passing through at least one side through hole 1000 to cooperate with the bottommost one of the matching holes D101), the holder structure 1 can be adjustably disposed on the different predetermined positions of the light detector D by cooperation of the at least one fixing element F and the matching holes D101, so that the holder structure 1 can be configured to adjust the relative perpendicular height H of the light beam guiding surface 2000 of the optical path correction structure 2 relative to the light receiving surface D100 of the light detector D by cooperation of the at least one fixing element F and the matching holes D101. Therefore, when the holder structure 1 is optionally configured to be adjustably disposed on different predetermined positions of the light detector D through at least one fixing element F, the relative perpendicular height H of the light beam guiding surface 2000 of the optical path correction structure 2 relative to the light receiving surface D100 of the light detector D can be adjustable (for example, the relative perpendicular height H shown in FIG. 3 can be adjusted to the relative perpendicular height H shown in FIG. 4, thereby reducing the relative perpendicular height H), so that the light beam guiding surface 2000 of the optical path correction structure 2 can be configured to effectively or accurately reflect (or guide, direct, transmit) the predetermined light beam B provided by the optical probe assembly S3 to the light receiving surface D100 of the light detector D so as to collect the predetermined light beam B by the light receiving surface D100 of the light detector D. For another example, the matching holes D101 may not be required, that is to say, the fixing element F may be directly screwed to the wall of the light detector D, thereby realizing stepless adjustment. However, the aforementioned details are disclosed for exemplary purposes only, and are not meant to limit the scope of the present disclosure.

Figure 5:
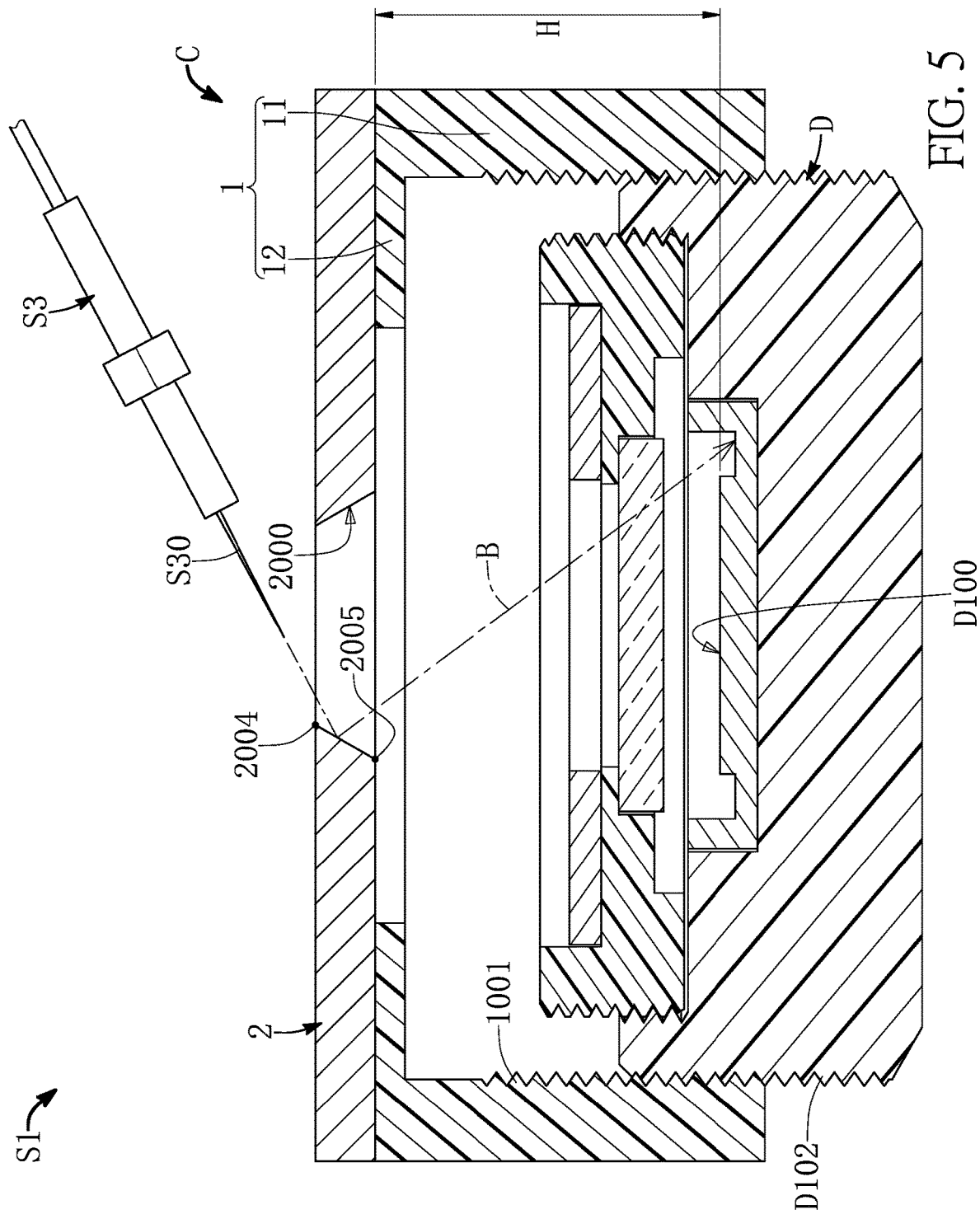
FIG. 5 is a partial schematic cross-sectional view of a third optical detection assembly using the optical path correction subassembly provided by the first embodiment of the present disclosure (when the predetermined light beam provided by the optical probe assembly cannot be guided to the light receiving surface of the light detector)
Figure 6:
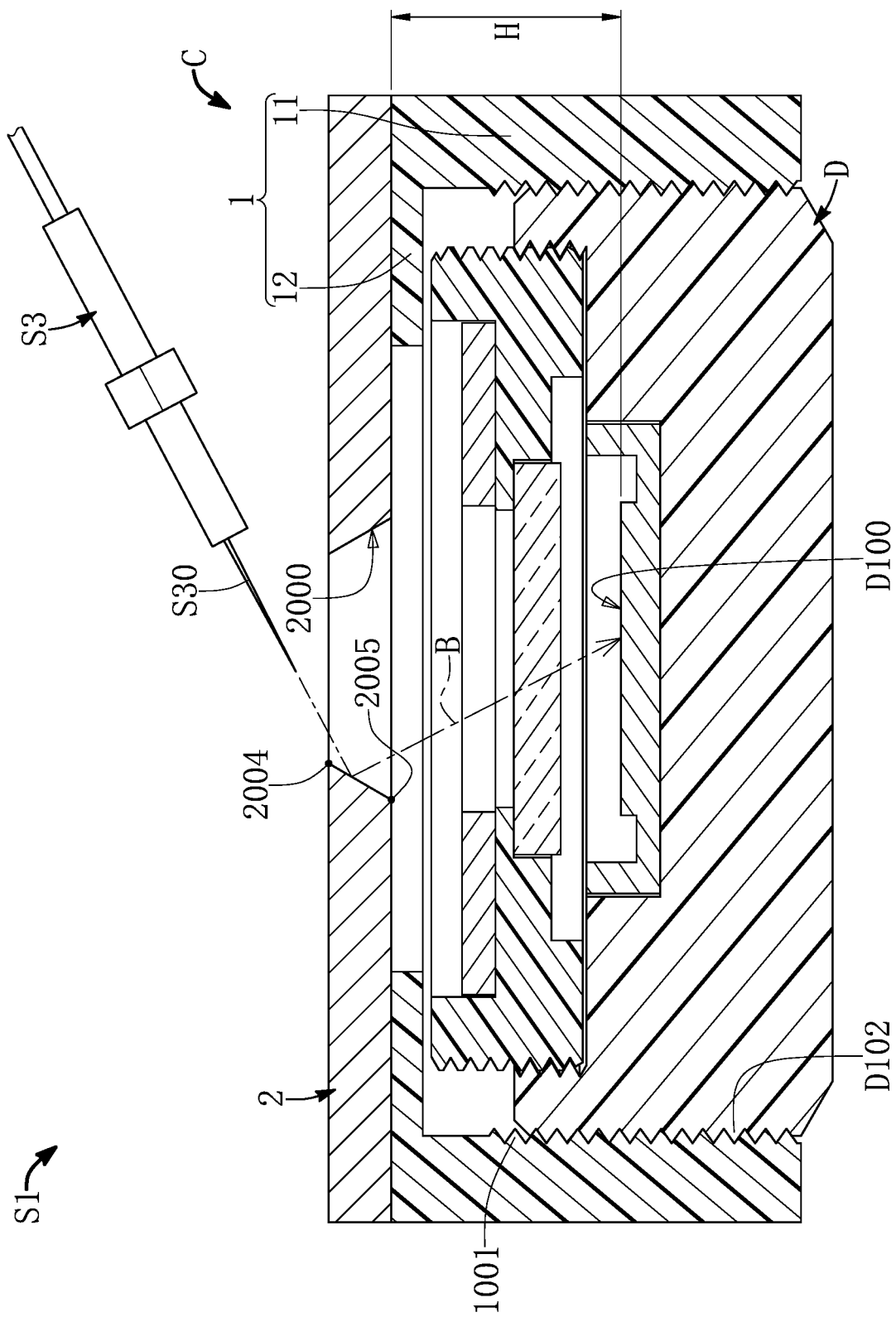
FIG. 6 is a partial schematic cross-sectional view of the third optical detection assembly using the optical path correction subassembly provided by the first embodiment of the present disclosure (when the predetermined light beam provided by the optical probe assembly can be guided to the light receiving surface of the light detector)

For example, referring to FIG. 5 and FIG. 6, when the holder structure 1 is optionally configured to be adjustably disposed on different predetermined positions of the light detector D by rotating (for example, the holder structure 1 can be rotated relative to the light detector D, or the light detector D can be rotated relative to the holder structure 1), the relative perpendicular height H of the light beam guiding surface 2000 of the optical path correction structure 2 relative to the light receiving surface D100 of the light detector D can be adjustable according to the holder structure 1 that can be adjustably disposed on the different predetermined positions of the light detector D. More particularly, when an inner thread 1001 of the holder structure 1 and an outer thread D102 of the light detector D cooperate with each other (For example, FIG. 5 shows that the holder structure 1 and the light detector D are relatively far away from each other through the rotation of the inner thread 1001 and the outer thread D102, and FIG. 6 shows that the holder structure 1 and the light detector D are closer to each other through the rotation of the inner thread 1001 and the outer thread D102), the holder structure 1 can be adjustably disposed on the different predetermined positions of the light detector D by cooperation of the inner thread 1001 of the holder structure 1 and the outer thread D102 of the light detector D, so that the holder structure 1 can be configured to adjust the relative perpendicular height H of the light beam guiding surface 2000 of the optical path correction structure 2 relative to the light receiving surface D100 of the light detector D by cooperation of the inner thread 1001 of the holder structure 1 and the outer thread D102 of the light detector D. Therefore, when the holder structure 1 is optionally configured to be adjustably disposed on different predetermined positions of the light detector D by rotating, the relative perpendicular height H of the light beam guiding surface 2000 of the optical path correction structure 2 relative to the light receiving surface D100 of the light detector D can be adjustable (for example, the relative perpendicular height H shown in FIG. 5 can be adjusted to the relative perpendicular height H shown in FIG. 6, thereby reducing the relative perpendicular height H), so that the light beam guiding surface 2000 of the optical path correction structure 2 can be configured to effectively or accurately reflect (or guide, direct, transmit) the predetermined light beam B provided by the optical probe assembly S3 to the light receiving surface D100 of the light detector D so as to collect the predetermined light beam B by the light receiving surface D100 of the light detector D. However, the aforementioned details are disclosed for exemplary purposes only, and are not meant to limit the scope of the present disclosure.

In conclusion, in one of possible embodiments, referring to FIG. 3 to FIG. 6, the relative perpendicular height H of the light beam guiding surface 2000 of the optical path correction structure 2 relative to the light receiving surface D100 of the light detector D can be adjustable, so that in the case where the orientation of the light detector D (such as using a photodiode) provided by the present disclosure does not need to be adjusted by an external adjustment mechanism, the light detector D can still be used to optically detect the quality of an optical probe S30 (i.e., an optical fiber) of the optical probe assembly S3 arranged in different orientations (such as different angles and/or heights) by use of the optical path correction subassembly C having a light beam guiding surface 2000 for effectively or accurately reflecting (or guiding, directing, transmitting) a predetermined light beam B provided by the optical probe S30 of the optical probe assembly S3 to a light receiving surface D100 of the light detector D. Hence, before, during and after the optical detection system S is applied to optically detect a plurality of predetermined objects (such as DUTs), the present disclosure can automatically detect the quality of the optical probe S30 of the optical probe assembly S3 by use of the optical path correction subassembly C having the light beam guiding surface 2000 without the assistance of the external adjustment mechanism, so as to simplify the mechanical structure and achieve the advantage of reducing cost. For example, the holder structure 1 can be adjustably disposed on the different predetermined positions of the light detector D by cooperation of the at least one fixing element F and the matching holes D101, so that the holder structure 1 can be configured to adjust the relative perpendicular height H of the light beam guiding surface 2000 of the optical path correction structure 2 relative to the light receiving surface D100 of the light detector D by cooperation of the at least one fixing element F and the matching holes D101 (It should be noted that the at least one fixing element F can be operated through the user's hand or a screwdriver, but both the user's hand or the screwdriver are used to provide a power source to drive the at least one fixing element F rather than the external adjustment mechanism). Alternatively, the holder structure 1 can be adjustably disposed on the different predetermined positions of the light detector D by cooperation of the inner thread 1001 of the holder structure 1 and the outer thread D102 of the light detector D, so that the holder structure 1 can be configured to adjust the relative perpendicular height H of the light beam guiding surface 2000 of the optical path correction structure 2 relative to the light receiving surface D100 of the light detector D by cooperation of the inner thread 1001 of the holder structure 1 and the outer thread D102 of the light detector D.

Figure 7:
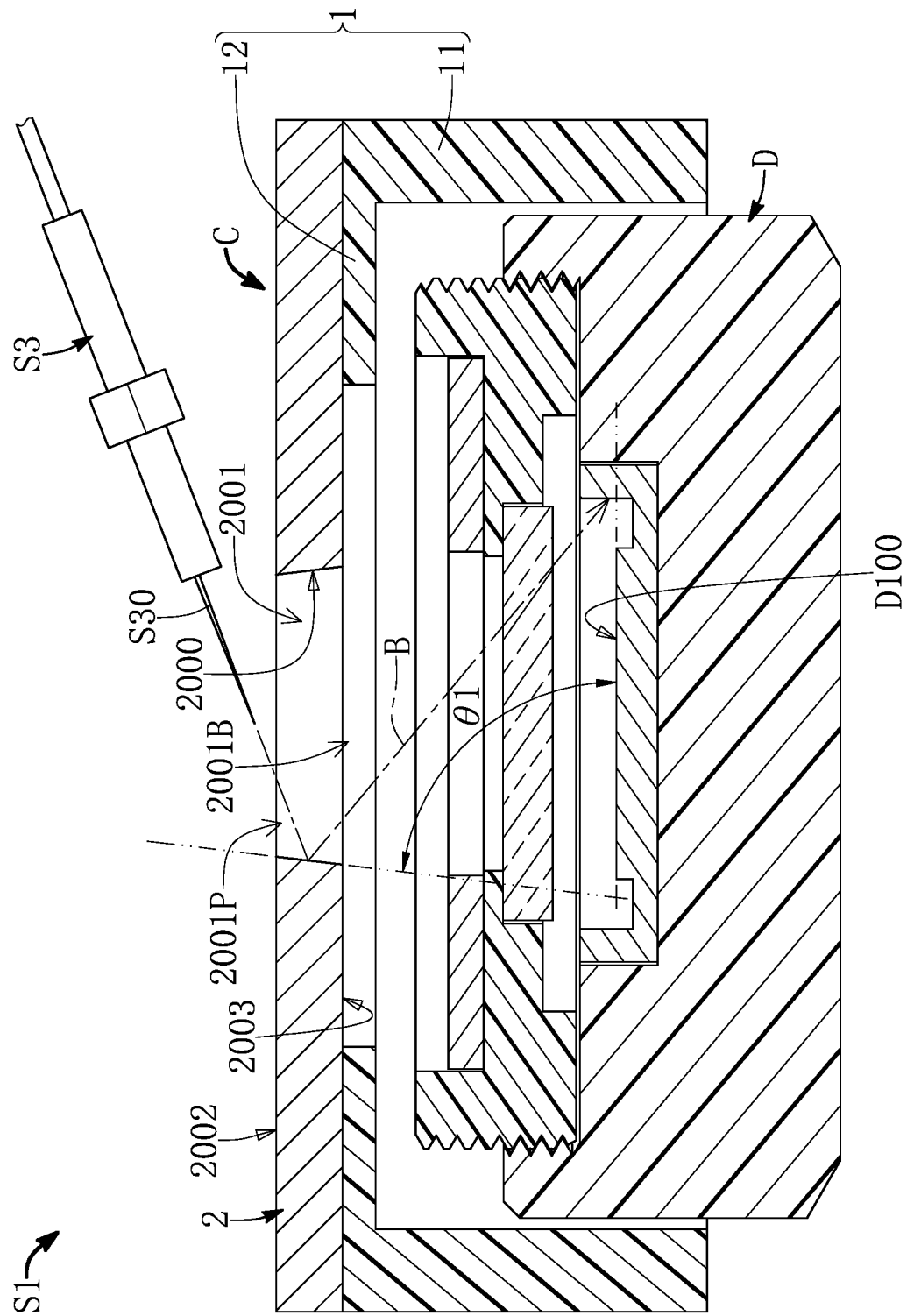
FIG. 7 is a partial schematic cross-sectional view of a fourth optical detection assembly using the optical path correction subassembly provided by the first embodiment of the present disclosure (when the predetermined light beam provided by the optical probe assembly cannot be guided to the light receiving surface of the light detector)
Figure 8:
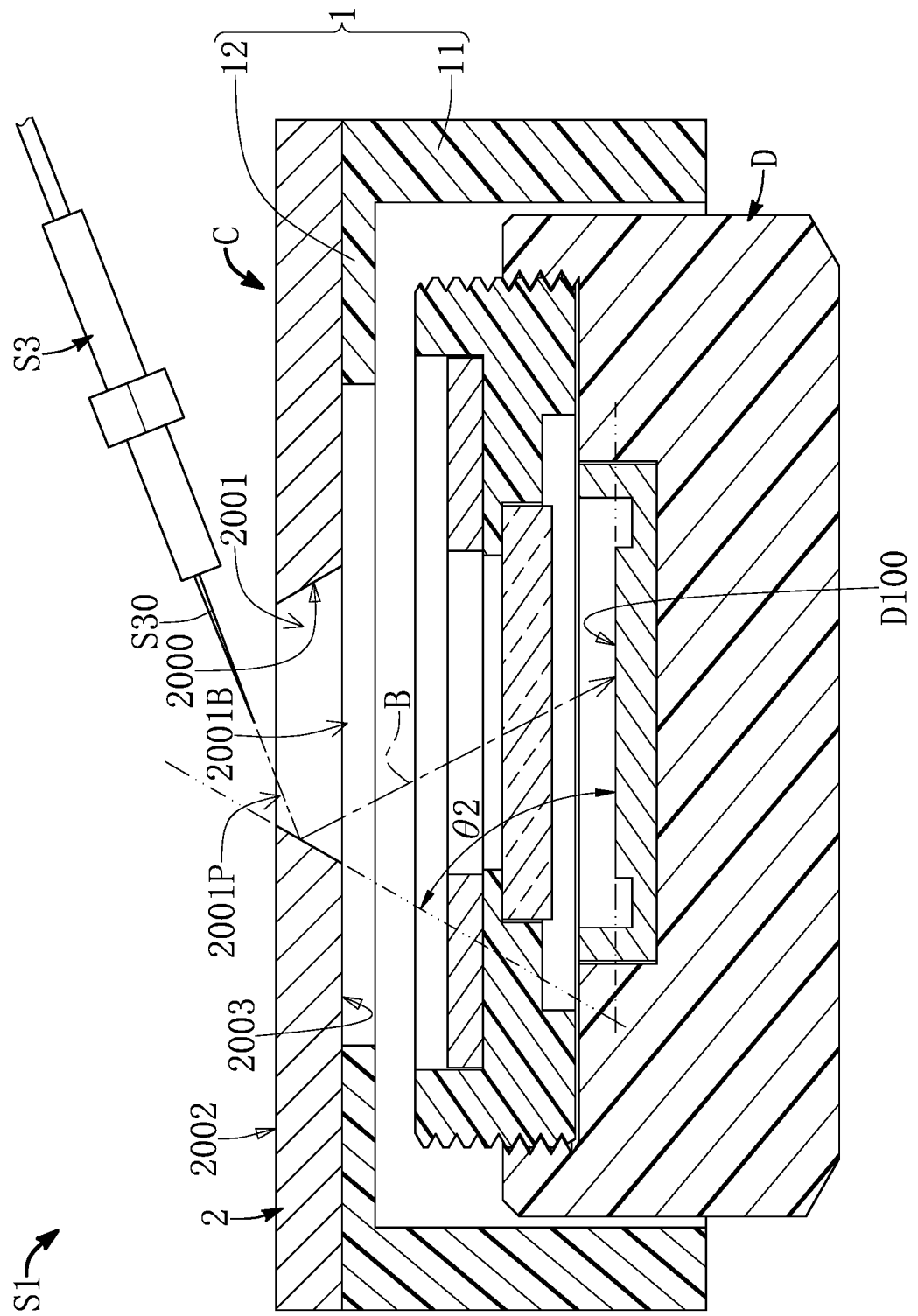
FIG. 8 is a partial schematic cross-sectional view of the fourth optical detection assembly using the optical path correction subassembly provided by the first embodiment of the present disclosure (when the predetermined light beam provided by the optical probe assembly can be guided to the light receiving surface of the light detector)

In another one of possible embodiments, referring to FIG. 7 and FIG. 8, when the optical path correction subassembly C is optionally configured to be replaceably disposed on the light detector D (or when the optical path correction structure 2 can be configured to be replaceably disposed on the holder structure 1), a relative inclination angle of the light beam guiding surface 2000 of the optical path correction structure 2 relative to the light receiving surface D100 of the light detector D can be adjustable. For example, FIG. 7 shows that the beam guiding surface 2000 of the optical path correction structure 2 is inclined with respect to the light receiving surface D100 of the light detector D to present a relative inclination angle θ1, and FIG. 8 shows the beam guiding surface 2000 of the optical path correction structure 2 is inclined with respect to the light receiving surface D100 of the light detector D to present a relative inclination angle θ2. For another example, the relative inclination angle θ1 and the relative inclination angle θ2 could be inclined with respect to the upper surface 2002 or the lower surface 2003 of the optical path correction structure 2. However, the aforementioned details are disclosed for exemplary purposes only, and are not meant to limit the scope of the present disclosure.

Figure 9:
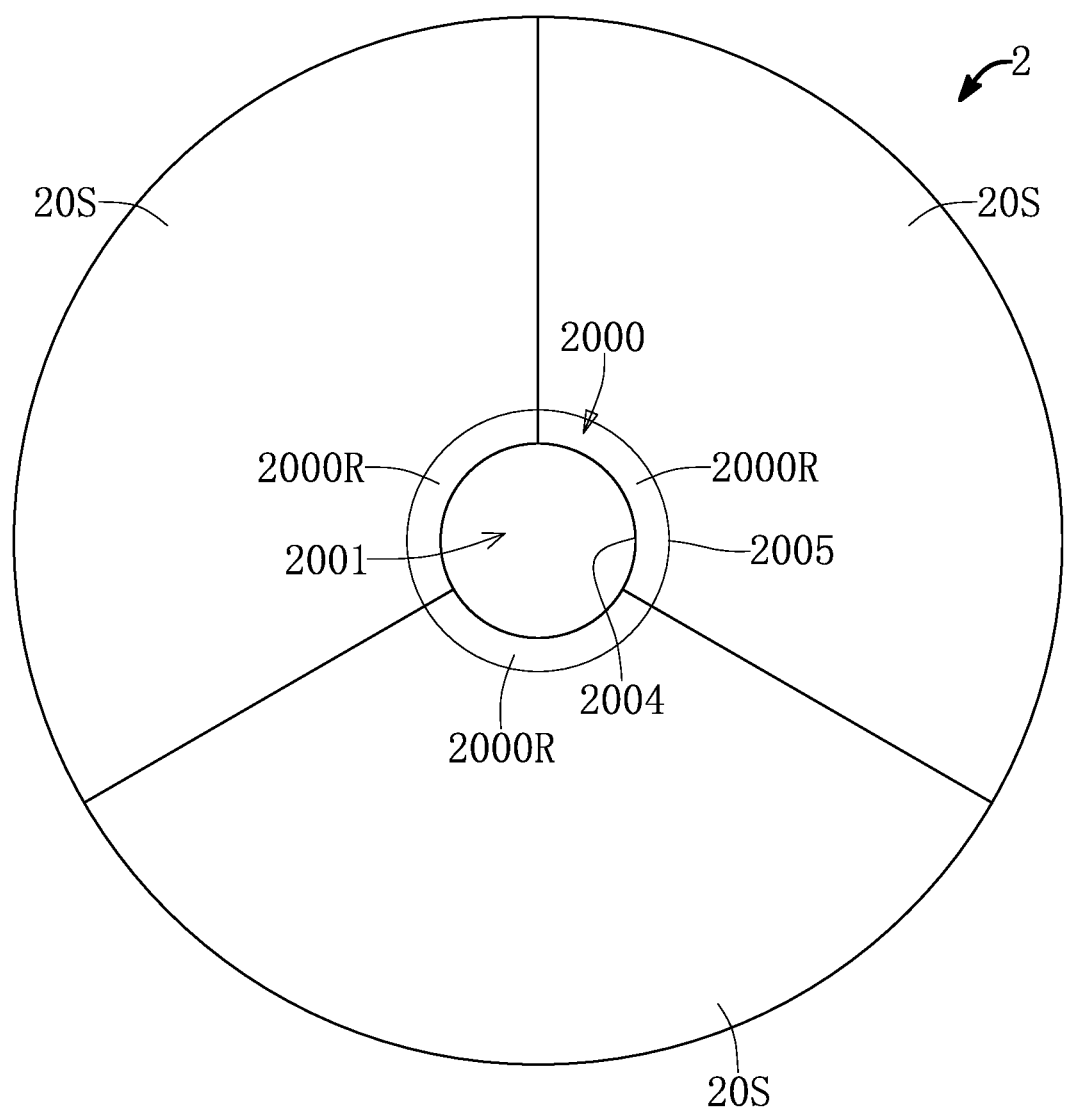
FIG. 9 is a schematic bottom view of a second optical path correction structure of the optical path correction subassembly provided by the first embodiment of the present disclosure.

For example, referring to FIG. 7 and FIG. 8, the optical path correction structure 2 includes a one-piece optical element (as shown in FIG. 2) or a combined-type optical element composed of a plurality of optical matching parts 20S (as shown in FIG. 9, the combined-type optical element can be composed of three optical matching parts 20S). More particularly, when the optical path correction subassembly C is optionally configured to be replaceably disposed on the light detector D (or when the optical path correction structure 2 can be configured to be replaceably disposed on the holder structure 1), the optical path correction subassembly C (i.e., the optical path correction structure 2) can be replaced by a plurality of different one-piece optical elements or a plurality of different combined-type optical elements (for example, the light beam guiding surfaces 2000 of the different one-piece optical elements have different inclination angles, respectively, or the light beam guiding surfaces 2000 of the different combined-type optical elements have different inclination angles, respectively), so that the relative inclination angle of the light beam guiding surface 2000 of the optical path correction structure 2 relative to the light receiving surface D100 of the light detector D can be adjustable or choiceful.

Therefore, when the optical path correction subassembly C is optionally configured to be replaceably disposed on the light detector D (or when the optical path correction structure 2 can be configured to be replaceably disposed on the holder structure 1), the relative inclination angle of the light beam guiding surface 2000 of the optical path correction structure 2 relative to the light receiving surface D100 of the light detector D can be adjustable (for example, the relative inclination angle θ1 of the beam guiding surface 2000 relative to the light receiving surface D100 as shown in FIG. 7 is greater than the relative inclination angle θ2 of the beam guiding surface 2000 relative to the light receiving surface D100 as shown in FIG. 8), so that the light beam guiding surface 2000 of the optical path correction structure 2 can be configured to effectively or accurately reflect (or guide, direct, transmit) the predetermined light beam B provided by the optical probe assembly S3 to the light receiving surface D100 of the light detector D so as to collect the predetermined light beam B by the light receiving surface D100 of the light detector D. However, the aforementioned details are disclosed for exemplary purposes only, and are not meant to limit the scope of the present disclosure.

Figure 10:
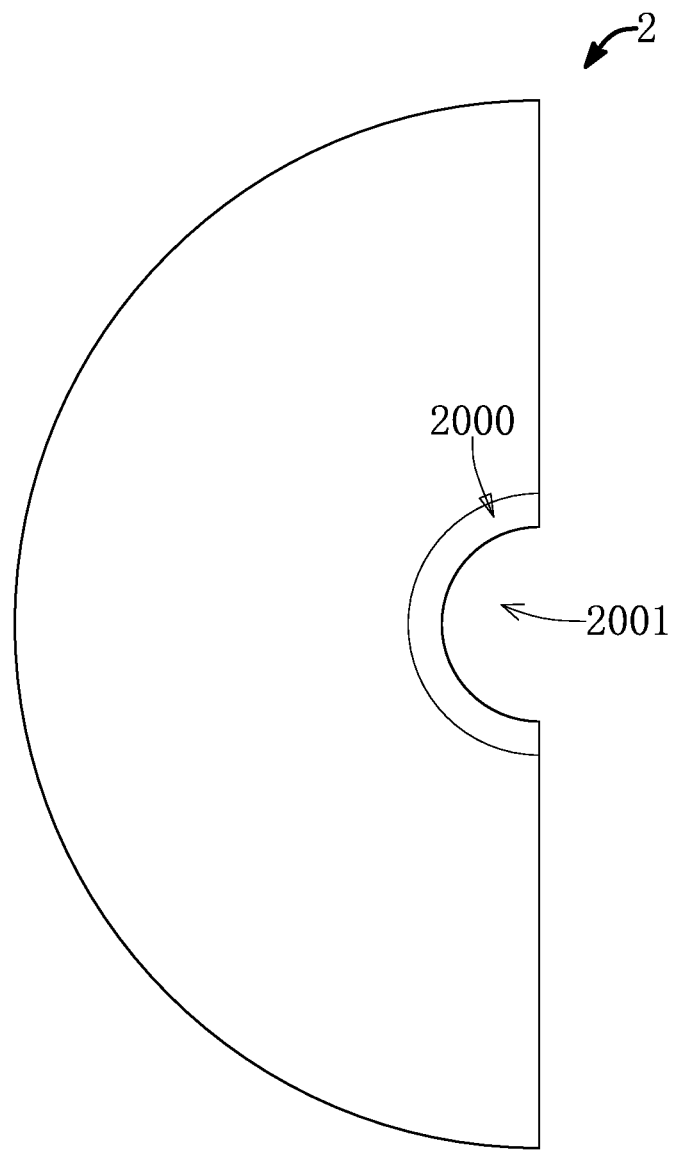
FIG. 10 is a schematic bottom view of a third optical path correction structure of the optical path correction subassembly provided by the first embodiment of the present disclosure.
Figure 11:
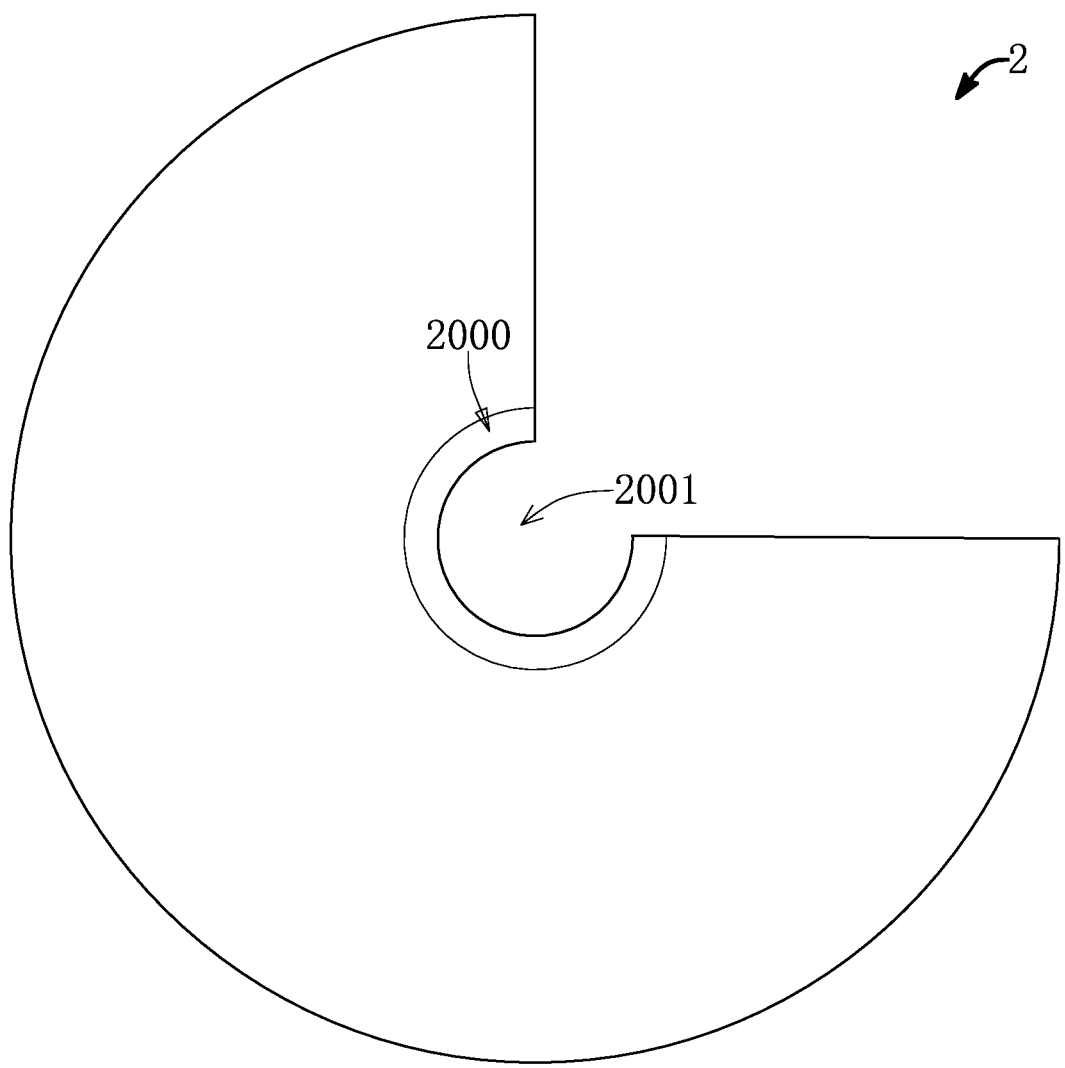
FIG. 11 is a schematic bottom view of a fourth optical path correction structure of the optical path correction subassembly provided by the first embodiment of the present disclosure.
Figure 12:
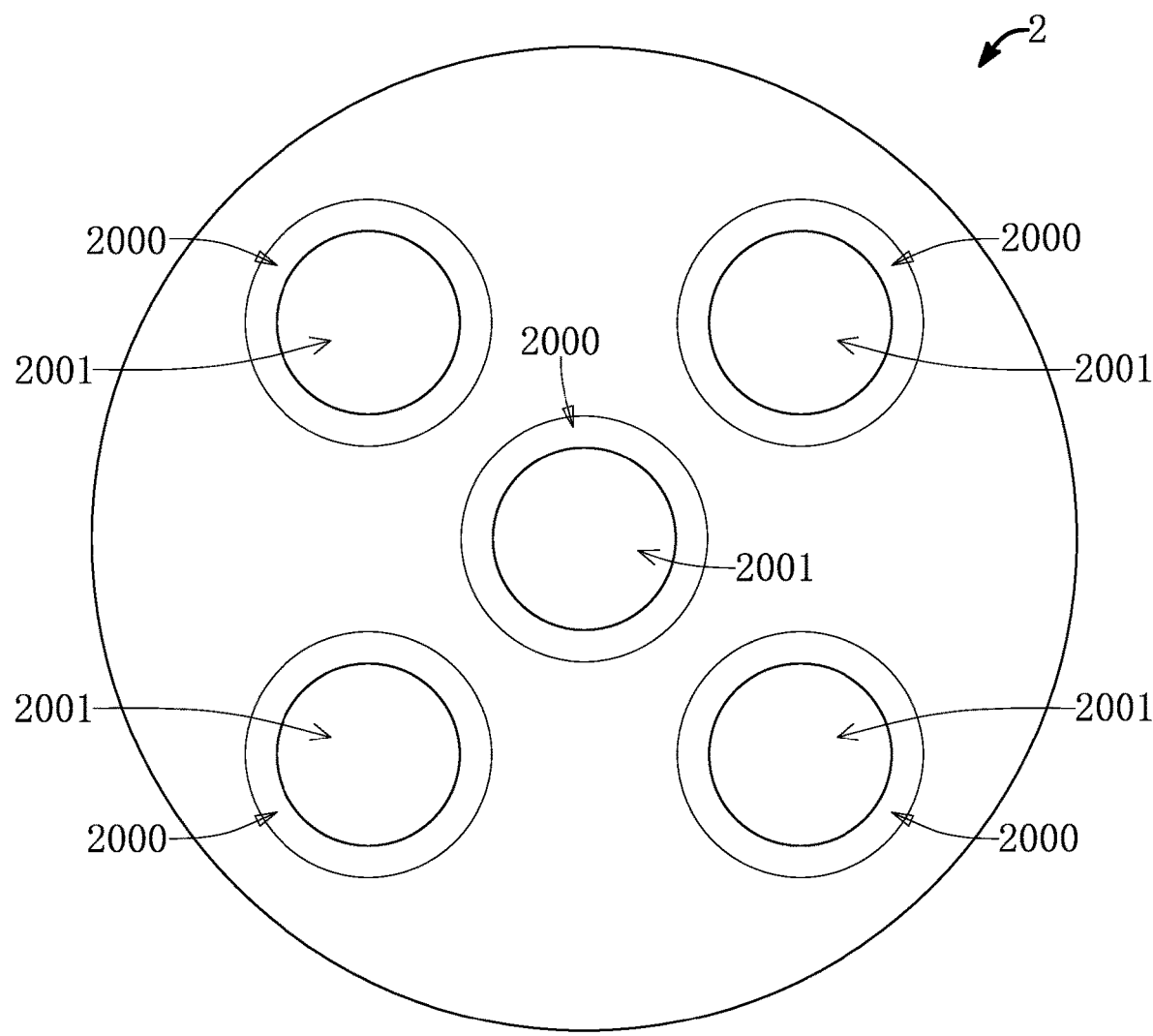
FIG. 12 is a schematic bottom view of a fifth optical path correction structure of the optical path correction subassembly provided by the first embodiment of the present disclosure.
Figure 13:
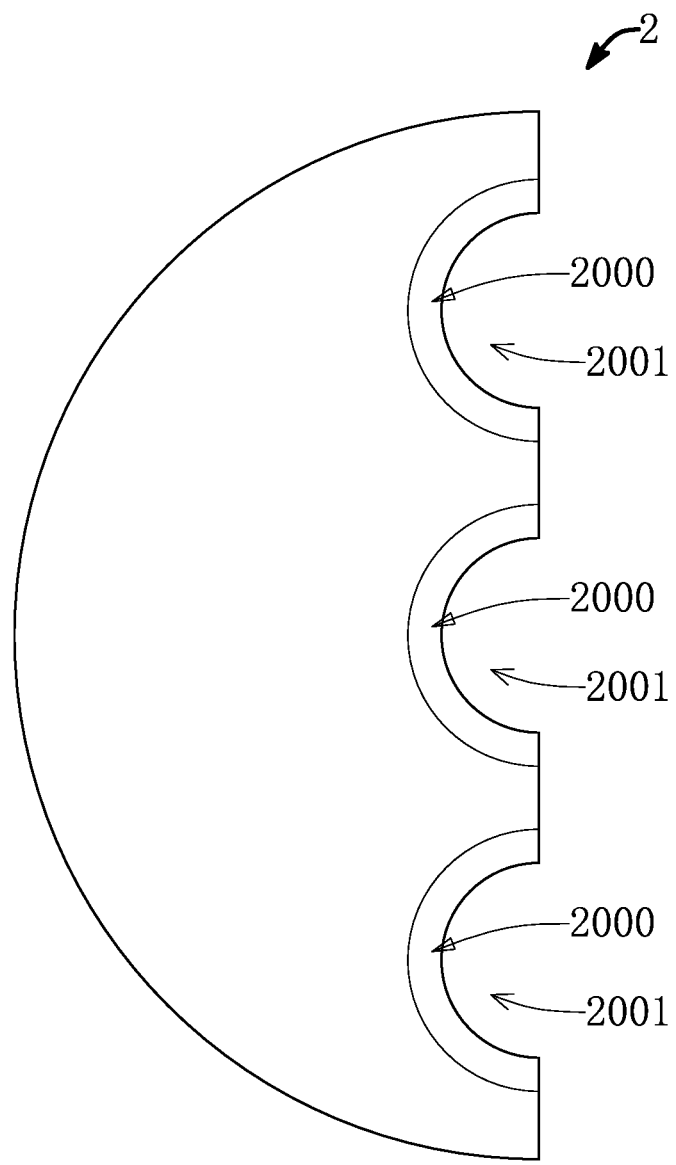
FIG. 13 is a schematic bottom view of a sixth optical path correction structure of the optical path correction subassembly provided by the first embodiment of the present disclosure.
Figure 14:
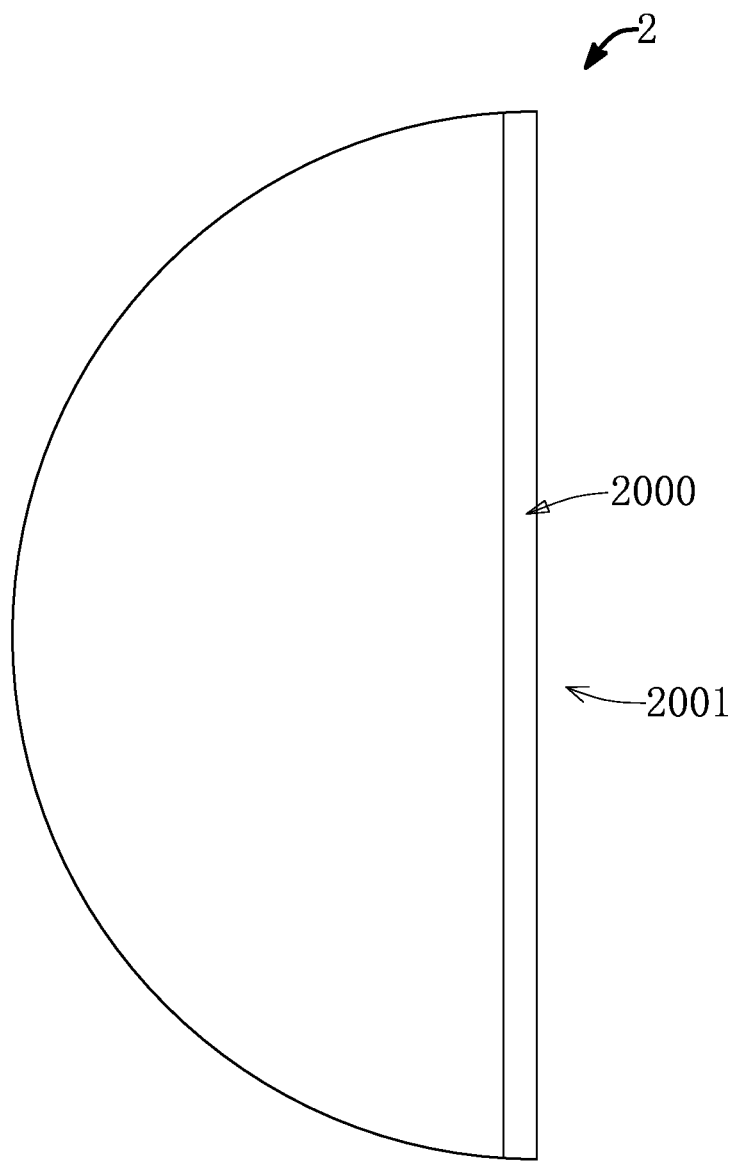
FIG. 14 is a schematic bottom view of a seventh optical path correction structure of the optical path correction subassembly provided by the first embodiment of the present disclosure.
Figure 15:
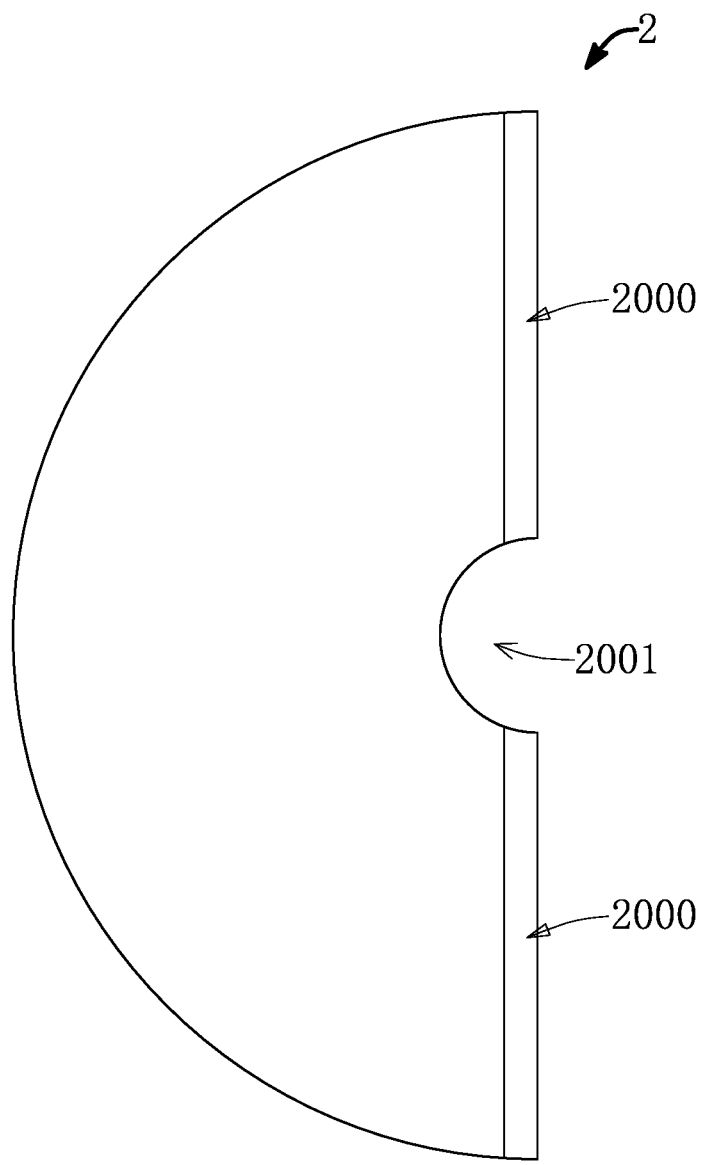
FIG. 15 is a schematic bottom view of an eighth optical path correction structure of the optical path correction subassembly provided by the first embodiment of the present disclosure.

It should be noted that, for example, referring to FIG. 2, FIG. 10 and FIG. 11, the optical path correction structure 2 has a through opening 2001 for accommodating the light beam guiding surface 2000, the through opening 2001 can be shaped as a closed shape (such as a circle shown in FIG. 2, a square or any closed shape) or an open shape (such as a ½ circle shown in FIG. 10, a ¾ circle shown in FIG. 11, or any open shape), and the through opening 2001 can be provided by the one-piece optical element (as shown in FIG. 1) or can be formed by combining the optical matching parts 20S of the combined-type optical element (as shown in FIG. 9). More particularly, the number of the through opening 2001 provided by the present disclosure may not only be one as shown in FIG. 2 and FIG. 10, for example, the number of the through opening 2001 disclosed in FIG. 12 and FIG. 13 may also be multiple, and the plurality of light beam guiding surface 2000 may have the same or different inclination angles. In addition, when the through opening 2001 can be shaped as the open shape, the optical path correction structure 2 has a strip-shaped beam guiding surface 2000 and an open-type through opening 2001 adjacent to the strip-shaped beam guiding surface 2000 (as shown in FIG. 14), or the optical path correction structure 2 has at least two strip-shaped beam guiding surfaces 2000 and a through opening 2001 located between the two strip-shaped beam guiding surfaces 2000 (as shown in FIG. 15). However, the aforementioned details are disclosed for exemplary purposes only, and are not meant to limit the scope of the present disclosure.

It should be noted that, for example, referring to FIG. 7 and FIG. 8, the through opening 2001 has a topmost opening 2001P and a bottommost opening 2011B, and a size of the topmost opening 2001P is smaller than a size of the bottommost opening 2011B. In addition, the size of the topmost opening 2001P and the size of the bottommost opening 2011B have a proportional relationship within a predetermined range, so that the relative inclination angle of the light beam guiding surface 2000 of the optical path correction structure 2 relative to the light receiving surface D100 of the light detector D can be adjustable. That is to say, on the premise that the distance between the topmost opening 2001P and the bottommost opening 2001B is fixed, when the ratio of the aperture of the topmost opening 2001P to the aperture of the bottommost opening 2001B is larger (or when the aperture of the topmost opening 2001P is smaller than the aperture of the bottommost opening 2001B), the relative inclination angle of the light beam guiding surface 2000 of the optical path correction structure 2 with respect to the light receiving surface D100 of the light detector D is larger. However, the aforementioned details are disclosed for exemplary purposes only, and are not meant to limit the scope of the present disclosure.

It should be noted that, for example, as shown in FIG. 9, the light beam guiding surface 2000 of the optical path correction structure 2 has a plurality of light beam guiding regions 2000R, and the light beam guiding regions 2000R can be configured to be disposed on the one-piece optical element (as shown in FIG. 2, three light beam guiding regions 2000R are distributed on the light beam guiding surface 2000) or configured to be respectively disposed on the optical matching parts 20S of the combined-type optical element (as shown in FIG. 9, three light beam guiding regions 2000R are respectively formed on the three optical matching parts 20S), and the light beam guiding regions 2000R have a same inclination angle or different inclination angles relative to the vertical line V. Therefore, the relative inclination angle of the light beam guiding surface 2000 of the optical path correction structure 2 relative to the light receiving surface D100 of the light detector D can be adjustable by virtue of "the same or different inclination angles provided by the light beam guiding regions 2000R of the one-piece optical element" or "the same or different inclination angles provided by the light beam guiding regions 2000R of the combined-type optical element." However, the aforementioned details are disclosed for exemplary purposes only, and are not meant to limit the scope of the present disclosure.

Figure 16:
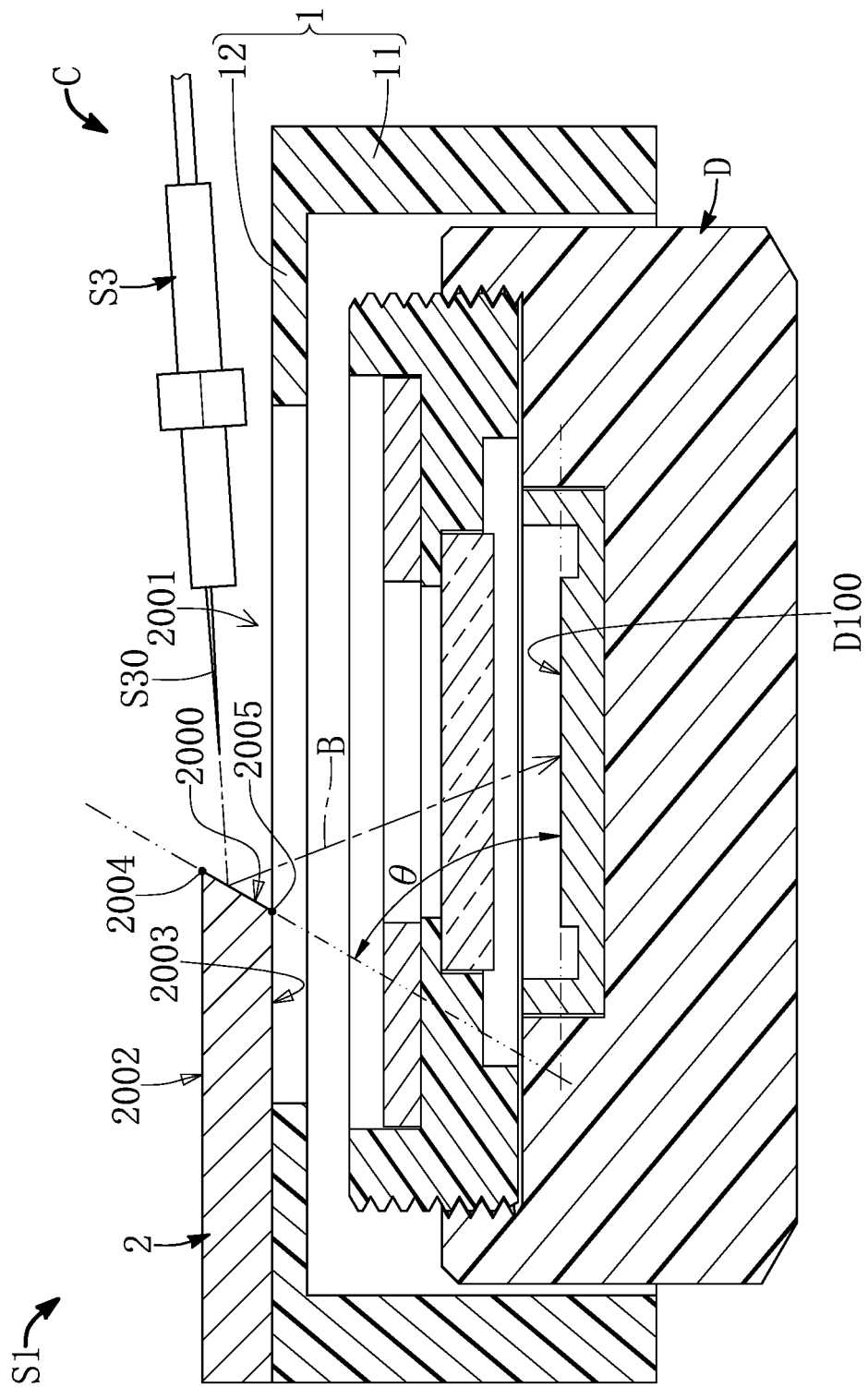
FIG. 16 is a partial schematic cross-sectional view of a fifth optical detection assembly using the optical path correction subassembly provided by the first embodiment of the present disclosure.

It is should be noted that, for example, as shown in FIG. 16, when the optical path correction structure 2 adopts any one of the patterns as shown in FIG. 10, FIG. 11, FIG. 13, FIG. 14 and FIG. 15, the optical probe assembly S3 can be set very close to a horizontal plane (that is to say, the inclination angle of the optical probe assembly S3 relative to the light receiving surface D100 of the light detector D can be very small), so that the optical probe assembly S3 can be used more flexibly in cooperation with the optical path correction structure 2.

In conclusion, in another one of possible embodiments, referring to FIG. 7 to FIG. 11, the relative inclination angle of the light beam guiding surface 2000 of the optical path correction structure 2 relative to the light receiving surface D100 of the light detector D is adjustable, so that in the case where the orientation of the light detector D (such as using a photodiode) provided by the present disclosure does not need to be adjusted by an external adjustment mechanism, the light detector D can still be used to optically detect the quality of an optical probe S30 (i.e., an optical fiber) of the optical probe assembly S3 arranged in different orientations (such as different angles and/or heights) by use of the optical path correction subassembly C having a light beam guiding surface 2000 for effectively or accurately reflecting (or guiding, directing, transmitting) a predetermined light beam B provided by the optical probe S30 of the optical probe assembly S3 to a light receiving surface D100 of the light detector D. Hence, before, during and after the optical detection system S is applied to optically detect a plurality of predetermined objects (such as DUTs), the present disclosure can automatically detect the quality of the optical probe S30 of the optical probe assembly S3 by use of the optical path correction subassembly C having the light beam guiding surface 2000 without the assistance of the external adjustment mechanism, so as to simplify the mechanical structure and achieve the advantage of reducing cost. For example, the present disclosure can adjust the relative inclination angle of the light beam guiding surface 2000 of the optical path correction structure 2 relative to the light receiving surface D100 of the light detector D through the following different method so as to meet the different customized requirements. The different methods for adjusting the relative inclination angle can be at least one or more of the following possible solutions: (1) the optical path correction structure 2 can be a one-piece optical element or a combined-type optical element composed of a plurality of optical matching parts 20S; (2) the through opening 2001 can be provided by the one-piece optical element or can be formed by combining the optical matching parts 20S of the combined-type optical element; (3) for the through opening 2001, the size of the topmost opening 2001P can be smaller than the size of the bottommost opening 2011B, and the size of the topmost opening 2001P and the size of the bottommost opening 2011B have a proportional relationship within a predetermined range; and (4) the light beam guiding regions 2000R can be configured to be disposed on the one-piece optical element or configured to be respectively disposed on the optical matching parts 20S of the combined-type optical element, and the light beam guiding regions 2000R have a same inclination angle or different inclination angles relative to a vertical line V.

In summary, in the first embodiment, referring to FIG. 1 to FIG. 11, the optical path correction structure 2 has a light beam guiding surface 2000 arranged as a reverse inclination facing the light receiving surface D100 of the light detector D in a vertical direction (that is to say, the optical path correction structure 2 has a light beam guiding surface 2000 arranged as a reverse inclination inclined relative to a vertical line V), and the light beam guiding surface 2000 of the optical path correction structure 2 is arranged at an acute angle θ relative to the light receiving surface D100 of the light detector D, so that when the holder structure 1 is optionally configured to be detachably disposed on the light detector D, the light beam guiding surface 2000 of the optical path correction structure 2 can be configured to guide a predetermined light beam B to the light receiving surface D100 of the light detector D so as to effectively or accurately collect the predetermined light beam B by the light receiving surface D100 of the light detector D.

Therefore, in the case where the orientation of the light detector D (such as using a photodiode) provided by the present disclosure does not need to be adjusted by an external adjustment mechanism, the light detector D can still be used to optically detect the quality of the optical probe S30 (i.e., an optical fiber) of an optical probe assembly S3 arranged in different orientations (such as different angles and/or heights) by use of the optical path correction subassembly C having a light beam guiding surface 2000 (for example, at least one of the relative perpendicular height H and the relative inclination angle of the light beam guiding surface 2000 of the optical path correction structure 2 relative to the light receiving surface D100 of the light detector D is adjustable) for guiding a predetermined light beam B to a light receiving surface D100 of the light detector D. Hence, before, during and after the optical detection system S is applied to optically detect a plurality of predetermined objects (such as DUTs), the present disclosure can automatically detect the quality of the optical probe S30 of the optical probe assembly S3 by use of the optical path correction subassembly C having the light beam guiding surface 2000 without the assistance of the external adjustment mechanism, so as to simplify the mechanical structure and achieve the advantage of reducing cost.

Second Embodiment

Figure 17:
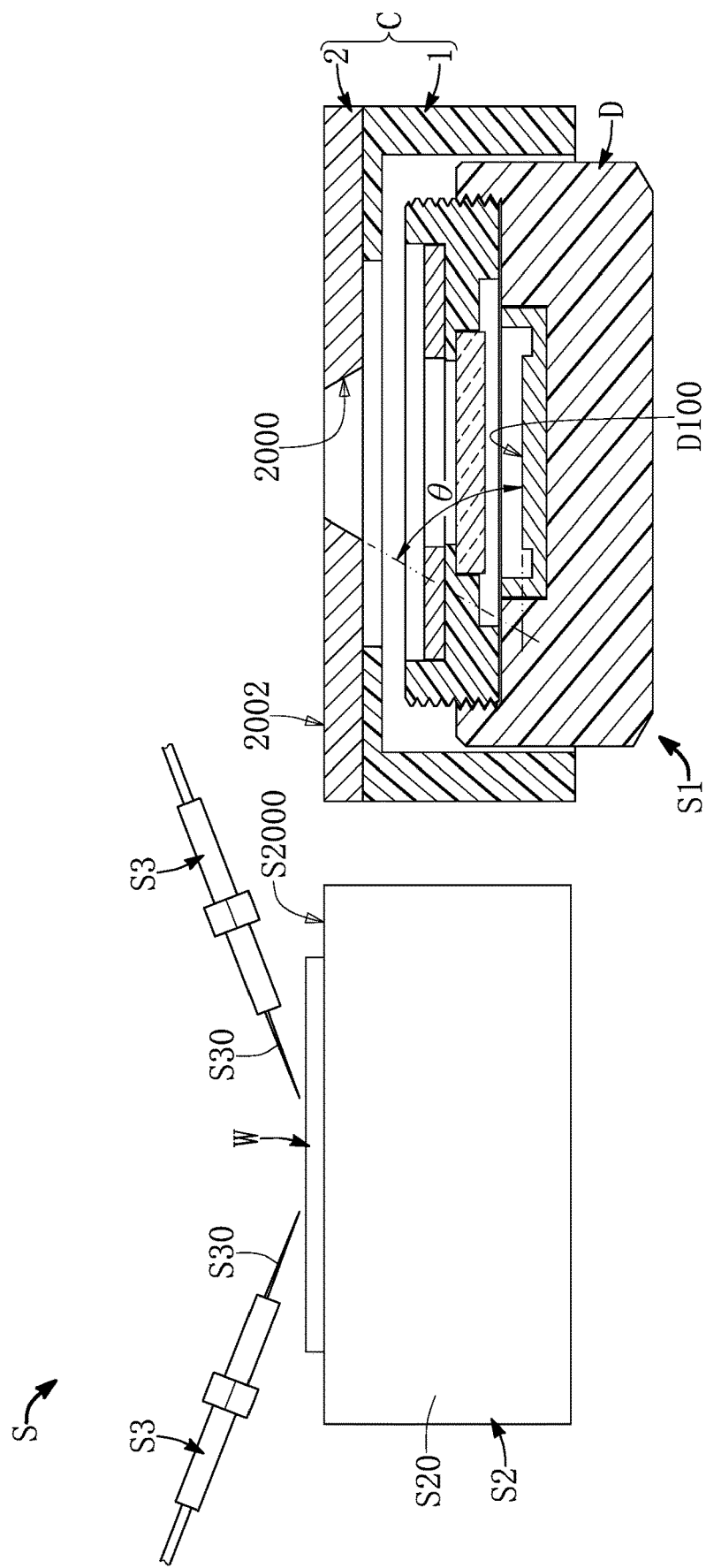
FIG. 17 is a partial schematic cross-sectional view of an optical detection system using the optical detection assembly provided by a second embodiment of the present disclosure (when the optical probe assembly is configured to be disposed above a chuck for optically detecting a predetermined object)
Figure 18:
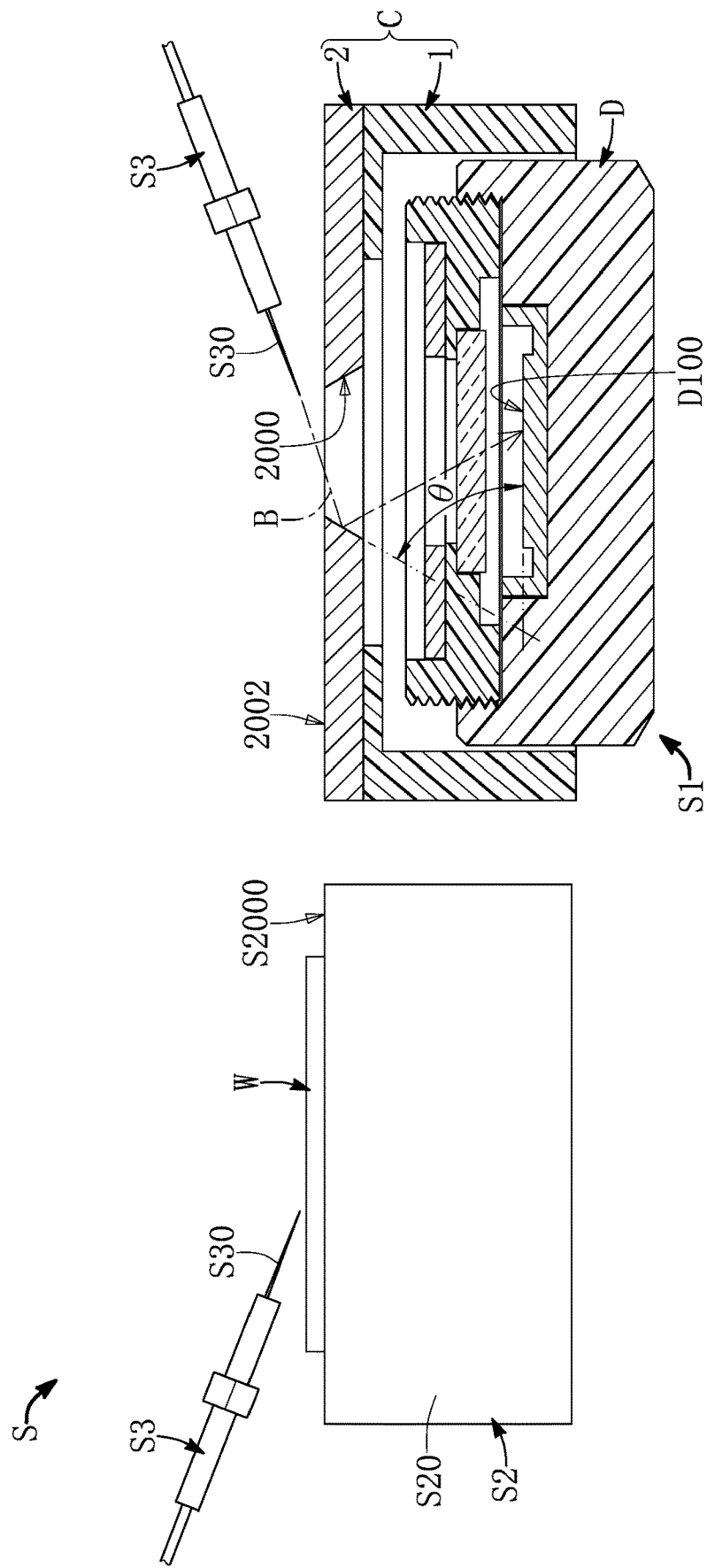
FIG. 18 is a partial schematic cross-sectional view of the optical detection system using the optical detection assembly provided by the second embodiment of the present disclosure (when an optical probe assembly needs to be moved to a position above the optical detection assembly to perform optical detection through the optical detection assembly)
Figure 19:
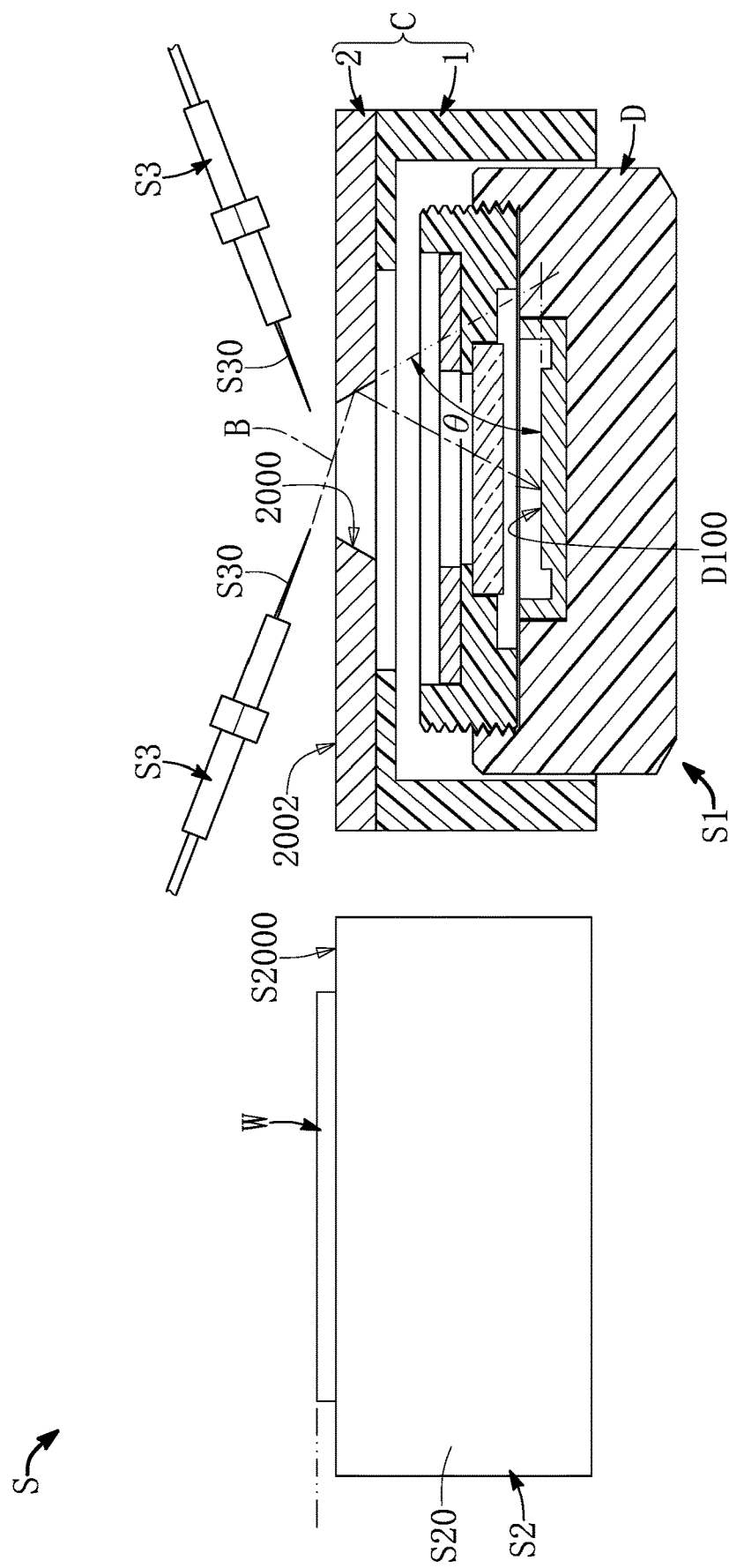
FIG. 19 is a partial schematic cross-sectional view of the optical detection system using the optical detection assembly provided by the second embodiment of the present disclosure (when another optical probe assembly needs to be moved to another position above the optical detection assembly to perform optical detection through the optical detection assembly).

Referring to FIG. 17 to FIG. 19, a second embodiment of the present disclosure provides an optical detection system S including an optical detection assembly S1 (can be provided by the first embodiment), a chuck stage S2 and two optical probe assemblies S3 (or using only one optical probe assembly S3). More particularly, the chuck stage S2 includes a chuck S20 for carrying a plurality of predetermined objects W (such as wafer having a plurality of chips). The optical probe assembly S3 can be configured to be disposed above the chuck S20 for optically detecting the predetermined object W (as shown in FIG. 17). The optical detection assembly S1 can be configured adjacent to the chuck S20 of the chuck stage S2 for optically detecting a predetermined light beam B provided by the optical probe assembly S3. Moreover, the optical detection assembly S1 includes a light detector D and an optical path correction subassembly C, the light detector D has a light receiving surface D100, and the optical path correction subassembly C includes a holder structure 1 detachably disposed on the light detector D and an optical path correction structure 2 carried by the holder structure 1. Furthermore, the optical path correction structure 2 has a light beam guiding surface 2000 arranged as a reverse inclination facing the light receiving surface D100 of the light detector D in a vertical direction, the light beam guiding surface 2000 of the optical path correction structure 2 is arranged at an acute angle θ relative to the light receiving surface D100 of the light detector D, and the light beam guiding surface 2000 of the optical path correction structure 2 can be configured to guide the predetermined light beam B to a light receiving surface D100 of the light detector D so as to facilitate collection of the predetermined light beam B.

It should be noted that, referring to FIG. 17 to FIG. 19, when the optical path correction subassembly C is optionally configured adjacent to the chuck S20 of the chuck stage S2, an upper surface 2002 of the optical path correction structure 2 of the optical path correction subassembly C can be equal to or lower than the wafer carrying surface S2000 of the chuck S20 of the chuck stage S2 so as to prevent the optical probe assembly S3 from being touched or collided by the optical path correction subassembly C. For example, as shown in FIG. 18, when one of the two optical probe assemblies S3 (such as the optical probe assembly S3 located on the right side of FIG. 18) needs to be moved to a position above the optical detection assembly S1 to perform optical detection through the optical detection assembly S1, by virtue of the upper surface 2002 of the optical path correction structure 2 of the optical path correction subassembly C being equal to or lower than the wafer carrying surface S2000 of the chuck S20 of the chuck stage S2, the optical probe assembly S3 located on the right side of FIG. 18 will not collide with the optical detection assembly S1 during the movement. In addition, as shown in FIG. 19, when another one of the two optical probe assemblies S3 (such as the optical probe assembly S3 located on the left side of FIG. 19) needs to be moved to another position above the optical detection assembly S1 to perform optical detection through the optical detection assembly S1, by virtue of the upper surface 2002 of the optical path correction structure 2 of the optical path correction subassembly C being equal to or lower than the wafer carrying surface S2000 of the chuck S20 of the chuck stage S2, the optical probe assembly S3 located on the left side of FIG. 19 will not collide with the optical detection assembly S1 during the movement. In addition, as shown in FIG. 17, after the two optical probe assemblies S3 have completed the optical detection through the optical detection assembly S1, the optical probe assembly S3 can be returned to a position above the chuck S20 for optically detecting the predetermined object W.

Therefore, since the orientation of the optical detection assembly S1 does not need to be tilted, the entire optical detection assembly S1 can be located at a lower position than the entire chuck stage S2 or at the same height as the entire wafer table (that is to say, the upper surface 2002 of the optical path correction structure 2 can be equal to or lower than the wafer carrying surface S2000 of the chuck stage S2), so that the optical probe S30 of the optical probe assembly S3 adjacent to the optical detection assembly S1 will not collide with the relatively low optical detection assembly S1 during the movement, and another optical probe S30 of the optical probe assembly S3 far from the optical detection assembly S1 will not be blocked by the relatively low optical detection assembly S1 and can be optically detected by the same light detector D. That is to say, there is only a relative horizontal movement between the optical probe assembly S3 and the chuck S20, so that even if detecting the quality of the optical probe S30 of the optical probe assembly S3 is frequent, the efficiency of detection is improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical path correction subassembly optionally configured to be applied to a light detector, the optical path correction subassembly including a holder structure and an optical path correction structure carried by the holder structure, and the optical path correction structure having a light beam guiding surface arranged as a reverse inclination inclined relative to a vertical line;

wherein, when the holder structure is optionally configured to be detachably disposed on the light detector, the light beam guiding surface of the optical path correction structure is configured to guide a predetermined light beam to a light receiving surface of the light detector so as to facilitate collection of the predetermined light beam;

wherein, when the holder structure is optionally configured to be detachably disposed on the light detector, the light beam guiding surface of the optical path correction structure is arranged at an acute angle relative to the light receiving surface of the light detector;

wherein, when an optical probe assembly is optionally configured for providing the predetermined light beam, the light beam guiding surface of the optical path correction structure is separate from the optical probe assembly;

wherein the light beam guiding surface is provided by an optical coating layer additionally formed on the optical path correction structure or by a material surface layer possessed by the optical path correction structure itself.

2. The optical path correction subassembly according to claim 1, wherein, when the holder structure is optionally configured to be movably disposed on the light detector, a relative perpendicular height of the light beam guiding surface of the optical path correction structure relative to the light receiving surface of the light detector is adjustable;

wherein, when the holder structure is optionally configured to be adjustably disposed on different predetermined positions of the light detector through at least one fixing element, the relative perpendicular height of the light beam guiding surface of the optical path correction structure relative to the light receiving surface of the light detector is adjustable according to the holder structure that is adjustably disposed on the different predetermined positions of the light detector;

wherein, when the at least one fixing element passes through at least one side through hole of the holder structure to cooperate with one of a plurality of matching holes of the light detector, the holder structure is adjustably disposed on the different predetermined positions of the light detector by cooperation of the at least one fixing element and the matching holes, so that the holder structure is configured to adjust the relative perpendicular height of the light beam guiding surface of the optical path correction structure relative to the light receiving surface of the light detector by cooperation of the at least one fixing element and the matching holes;

wherein, when the holder structure is optionally configured to be adjustably disposed on different predetermined positions of the light detector by rotating, the relative perpendicular height of the light beam guiding surface of the optical path correction structure relative to the light receiving surface of the light detector is adjustable according to the holder structure that is adjustably disposed on the different predetermined positions of the light detector;

wherein, when an inner thread of the holder structure and an outer thread of the light detector cooperate with each other, the holder structure is adjustably disposed on the different predetermined positions of the light detector by cooperation of the inner thread of the holder structure and the outer thread of the light detector, so that the holder structure is configured to adjust the relative perpendicular height of the light beam guiding surface of the optical path correction structure relative to the light receiving surface of the light detector by cooperation of the inner thread of the holder structure and the outer thread of the light detector.

3. The optical path correction subassembly according to claim 1, wherein, when the optical path correction subassembly is optionally configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein, the optical path correction structure includes a one-piece optical element or a combined-type optical element composed of a plurality of optical matching parts;

wherein the optical path correction structure has a through opening for accommodating the light beam guiding surface, the through opening is shaped as a closed shape or an open shape, and the through opening is provided by the one-piece optical element or is formed by combining the optical matching parts of the combined-type optical element;

wherein the through opening has a topmost opening and a bottommost opening, a size of the topmost opening is smaller than a size of the bottommost opening, and the size of the topmost opening and the size of the bottommost opening have a proportional relationship within a predetermined range;

wherein the light beam guiding surface of the optical path correction structure has a plurality of light beam guiding regions, and the light beam guiding regions are configured to be disposed on the one-piece optical element or configured to be respectively disposed on the optical matching parts of the combined-type optical element, and the light beam guiding regions have a same inclination angle or different inclination angles relative to the vertical line.

4. The optical path correction subassembly according to claim 1, wherein, when the holder structure is optionally configured to be movably disposed on the light detector, a relative perpendicular height of the light beam guiding surface of the optical path correction structure relative to the light receiving surface of the light detector is adjustable;

wherein, when the optical path correction subassembly is optionally configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein the light beam guiding surface of the optical path correction structure is configured to be located on an optical path between the optical probe assembly for providing the predetermined light beam and the light receiving surface of the light detector;

wherein the light beam guiding surface of the optical path correction structure has a plurality of light beam guiding regions, and the light beam guiding regions have a same inclination angle or different inclination angles relative to the vertical line;

wherein the optical path correction structure has an upper surface, a lower surface opposite to the upper surface, a top corner interface connected between the upper surface and the light beam guiding surface, and a bottom corner interface connected between the lower surface and the light beam guiding surface, and the top corner interface and the bottom corner interface directly face the light detector in a perpendicular direction;

wherein the holder structure includes a matching portion and a carrying portion disposed on the matching portion, the matching portion of the holder structure is configured to cooperate with the light detector, and the carrying portion of the holder structure is configured to carry the optical path correction structure;

wherein the optical path correction structure is disposed outside the holder structure and located on a top side of the holder structure, or is disposed inside the holder structure and surrounded by the holder structure;

wherein the holder structure and the optical path correction structure are integrally formed as a single optical member, and the light beam guiding surface is formed on the single optical member;

wherein, when the optical path correction subassembly is optionally configured adjacent to a chuck of a chuck stage, the upper surface of the optical path correction structure of the optical path correction subassembly is equal to or lower than a wafer carrying surface of the chuck of the chuck stage so as to prevent the optical probe assembly from being touched by the optical path correction subassembly.

5. The optical path correction subassembly according to claim 1, wherein the light beam guiding surface of the optical path correction structure is configured to be located on an optical path between the optical probe assembly for providing the predetermined light beam and the light receiving surface of the light detector.

6. The optical path correction subassembly according to claim 1, wherein the optical path correction subassembly is configured to be applied to an optical detection system including a chuck stage and the optical probe assembly configured to be disposed above the chuck stage.

7. An optical detection assembly, comprising:

a light detector having a light receiving surface; and an optical path correction subassembly including a holder structure detachably disposed on the light detector and an optical path correction structure carried by the holder structure;

wherein, the optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector;

wherein, the light beam guiding surface of the optical path correction structure is configured to guide a predetermined light beam to the light receiving surface of the light detector so as to facilitate collection of the predetermined light beam;

wherein, when an optical probe assembly is optionally configured for providing the predetermined light beam, the light beam guiding surface of the optical path correction structure is separate from the optical probe assembly;

wherein the light beam guiding surface is provided by an optical coating layer additionally formed on the optical path correction structure or by a material surface layer possessed by the optical path correction structure itself.

8. The optical detection assembly according to claim 7, wherein, when the holder structure is configured to be movably disposed on the light detector, a relative perpendicular height of the light beam guiding surface of the optical path correction structure relative to the light receiving surface of the light detector is adjustable;

wherein, when the holder structure is configured to be adjustably disposed on different predetermined positions of the light detector through at least one fixing element, the relative perpendicular height of the light beam guiding surface of the optical path correction structure relative to the light receiving surface of the light detector is adjustable according to the holder structure that is adjustably disposed on the different predetermined positions of the light detector;

wherein, when the at least one fixing element passes through at least one side through hole of the holder structure to cooperate with one of a plurality of matching holes of the light detector, the holder structure is adjustably disposed on the different predetermined positions of the light detector by cooperation of the at least one fixing element and the matching holes, so that the holder structure is configured to adjust the relative perpendicular height of the light beam guiding surface of the optical path correction structure relative to the light receiving surface of the light detector by cooperation of the at least one fixing element and the matching holes;

wherein, when the holder structure is configured to be adjustably disposed on different predetermined positions of the light detector by rotating, the relative perpendicular height of the light beam guiding surface of the optical path correction structure relative to the light receiving surface of the light detector is adjustable according to the holder structure that is adjustably disposed on the different predetermined positions of the light detector;

wherein, when an inner thread of the holder structure and an outer thread of the light detector cooperate with each other, the holder structure is adjustably disposed on the different predetermined positions of the light detector by cooperation of the inner thread of the holder structure and the outer thread of the light detector, so that the holder structure is configured to adjust the relative perpendicular height of the light beam guiding surface of the optical path correction structure relative to the light receiving surface of the light detector by cooperation of the inner thread of the holder structure and the outer thread of the light detector.

9. The optical detection assembly according to claim 7, wherein, when the optical path correction subassembly is configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein, the optical path correction structure includes a one-piece optical element or a combined-type optical element composed of a plurality of optical matching parts;

wherein the optical path correction structure has a through opening for accommodating the light beam guiding surface, the through opening is shaped as a closed shape or an open shape, and the through opening is provided by the one-piece optical element or is formed by combining the optical matching parts of the combined-type optical element;

wherein the through opening has a topmost opening and a bottommost opening, a size of the topmost opening is smaller than a size of the bottommost opening, and the size of the topmost opening and the size of the bottommost opening have a proportional relationship within a predetermined range;

wherein the light beam guiding surface of the optical path correction structure has a plurality of light beam guiding regions, and the light beam guiding regions are configured to be disposed on the one-piece optical element or configured to be respectively disposed on the optical matching parts of the combined-type optical element, and the light beam guiding regions have a same inclination angle or different inclination angles relative to a vertical line.

10. The optical detection assembly according to claim 7, wherein, when the holder structure is configured to be movably disposed on the light detector, a relative perpendicular height of the light beam guiding surface of the optical path correction structure relative to the light receiving surface of the light detector is adjustable;

wherein, when the optical path correction subassembly is configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein the light beam guiding surface of the optical path correction structure is configured to be located on an optical path between the optical probe assembly for providing the predetermined light beam and the light receiving surface of the light detector;

wherein the light beam guiding surface of the optical path correction structure has a plurality of light beam guiding regions, and the light beam guiding regions have a same inclination angle or different inclination angles relative to a vertical line;

wherein the optical path correction structure has an upper surface, a lower surface opposite to the upper surface, a top corner interface connected between the upper surface and the light beam guiding surface, and a bottom corner interface connected between the lower surface and the light beam guiding surface, and the top corner interface and the bottom corner interface directly face the light detector in a perpendicular direction;

wherein the holder structure includes a matching portion and a carrying portion disposed on the matching portion, the matching portion of the holder structure is configured to cooperate with the light detector, and the carrying portion of the holder structure is configured to carry the optical path correction structure;

wherein the optical path correction structure is disposed outside the holder structure and located on a top side of the holder structure, or is disposed inside the holder structure and surrounded by the holder structure;

wherein the holder structure and the optical path correction structure are integrally formed as a single optical member, and the light beam guiding surface is formed on the single optical member;

wherein, when the optical path correction subassembly is optionally configured adjacent to a chuck of a chuck stage, the upper surface of the optical path correction structure of the optical path correction subassembly is equal to or lower than a wafer carrying surface of the chuck of the chuck stage so as to prevent the optical probe assembly from being touched by the optical path correction subassembly.

11. The optical detection assembly according to claim 7, wherein the light beam guiding surface of the optical path correction structure is configured to be located on an optical path between the optical probe assembly for providing the predetermined light beam and the light receiving surface of the light detector.

12. An optical detection system, comprising:
a chuck stage including a chuck for carrying a plurality of predetermined objects;
an optical probe assembly configured to be disposed above the chuck for optically detecting the predetermined object; and
an optical detection assembly configured adjacent to the chuck of the chuck stage for optically detecting a predetermined light beam provided by the optical probe assembly;
wherein the optical detection assembly includes a light detector and an optical path correction subassembly, the light detector has a light receiving surface, and the optical path correction subassembly includes a holder structure detachably disposed on the light detector and an optical path correction structure carried by the holder structure;
wherein, the optical path correction structure has a light beam guiding surface arranged as a reverse inclination facing the light receiving surface of the light detector in a vertical direction, and the light beam guiding surface of the optical path correction structure is arranged at an acute angle relative to the light receiving surface of the light detector;
wherein, the light beam guiding surface of the optical path correction structure is configured to guide the predetermined light beam to the light receiving surface of the light detector so as to facilitate collection of the predetermined light beam;
wherein an upper surface of the optical path correction structure of the optical path correction subassembly is equal to or lower than a wafer carrying surface of the chuck of the chuck stage;
wherein the light beam guiding surface of the optical path correction structure is configured to be located on an optical path between the optical probe assembly for providing the predetermined light beam and the light receiving surface of the light detector;
wherein the light beam guiding surface is provided by an optical coating layer additionally formed on the optical path correction structure or by a material surface layer possessed by the optical path correction structure itself.

13. The optical detection system according to claim 12, wherein, when the holder structure is configured to be movably disposed on the light detector, a relative perpendicular height of the light beam guiding surface of the optical path correction structure relative to the light receiving surface of the light detector is adjustable;

wherein, when the holder structure is configured to be adjustably disposed on different predetermined positions of the light detector through at least one fixing element, the relative perpendicular height of the light beam guiding surface of the optical path correction structure relative to the light receiving surface of the light detector is adjustable according to the holder structure that is adjustably disposed on the different predetermined positions of the light detector;

wherein, when the at least one fixing element passes through at least one side through hole of the holder structure to cooperate with one of a plurality of matching holes of the light detector, the holder structure is adjustably disposed on the different predetermined positions of the light detector by cooperation of the at least one fixing element and the matching holes, so that the holder structure is configured to adjust the relative perpendicular height of the light beam guiding surface of the optical path correction structure relative to the light receiving surface of the light detector by cooperation of the at least one fixing element and the matching holes;

wherein, when the holder structure is configured to be adjustably disposed on different predetermined positions of the light detector by rotating, the relative perpendicular height of the light beam guiding surface of the optical path correction structure relative to the light receiving surface of the light detector is adjustable according to the holder structure that is adjustably disposed on the different predetermined positions of the light detector;

wherein, when an inner thread of the holder structure and an outer thread of the light detector cooperate with each other, the holder structure is adjustably disposed on the different predetermined positions of the light detector by cooperation of the inner thread of the holder structure and the outer thread of the light detector, so that the holder structure is configured to adjust the relative perpendicular height of the light beam guiding surface of the optical path correction structure relative to the light receiving surface of the light detector by cooperation of the inner thread of the holder structure and the outer thread of the light detector.

14. The optical detection system according to claim 12, wherein, when the optical path correction subassembly is configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein, the optical path correction structure includes a one-piece optical element or a combined-type optical element composed of a plurality of optical matching parts;

wherein the optical path correction structure has a through opening for accommodating the light beam guiding surface, the through opening is shaped as a closed shape or an open shape, and the through opening is provided by the one-piece optical element or is formed by combining the optical matching parts of the combined-type optical element;

wherein the through opening has a topmost opening and a bottommost opening, a size of the topmost opening is smaller than a size of the bottommost opening, and the size of the topmost opening and the size of the bottommost opening have a proportional relationship within a predetermined range;

wherein the light beam guiding surface of the optical path correction structure has a plurality of light beam guiding regions, and the light beam guiding regions are configured to be disposed on the one-piece optical element or configured to be respectively disposed on the optical matching parts of the combined-type optical element, and the light beam guiding regions have a same inclination angle or different inclination angles relative to a vertical line.

15. The optical detection system according to claim 12, wherein, when the holder structure is configured to be movably disposed on the light detector, a relative perpendicular height of the light beam guiding surface of the optical path correction structure relative to the light receiving surface of the light detector is adjustable;

wherein, when the optical path correction subassembly is configured to be replaceably disposed on the light detector, or when the optical path correction structure is configured to be replaceably disposed on the holder structure, a relative inclination angle of the light beam guiding surface of the optical path correction structure relative to the light receiving surface of the light detector is adjustable;

wherein the light beam guiding surface of the optical path correction structure has a plurality of light beam guiding regions, and the light beam guiding regions have a same inclination angle or different inclination angles relative to a vertical line;

wherein the optical path correction structure has a lower surface opposite to the upper surface, a top corner interface connected between the upper surface and the light beam guiding surface, and a bottom corner interface connected between the lower surface and the light beam guiding surface, and the top corner interface and the bottom corner interface directly face the light detector in a perpendicular direction;

wherein the holder structure includes a matching portion and a carrying portion disposed on the matching portion, the matching portion of the holder structure is configured to cooperate with the light detector, and the carrying portion of the holder structure is configured to carry the optical path correction structure;

wherein the optical path correction structure is disposed outside the holder structure and located on a top side of the holder structure, or is disposed inside the holder structure and surrounded by the holder structure;

wherein the holder structure and the optical path correction structure are integrally formed as a single optical member, and the light beam guiding surface is formed on the single optical member.

* * * * *